(12) United States Patent
Nakamura et al.

(10) Patent No.: US 7,251,883 B2
(45) Date of Patent: Aug. 7, 2007

(54) ELECTRONIC-COMPONENT ALIGNMENT METHOD AND APPARATUS THEREFOR

(75) Inventors: Atsushi Nakamura, Kanagawa (JP);
Norio Kawatani, Kanagawa (JP);
Masahisa Hosoi, Kanagawa (JP);
Kazumasa Osoniwa, Chiba (JP);
Hiroshi Tokunaga, Tokyo (JP)

(73) Assignee: Sony Corporation, Tokyo (JP)

( * ) Notice: Subject to any disclaimer, the term of this patent is extended or adjusted under 35 U.S.C. 154(b) by 215 days.

(21) Appl. No.: 10/495,905

(22) PCT Filed: Sep. 30, 2003

(86) PCT No.: PCT/JP03/12520
§ 371 (c)(1),
(2), (4) Date: May 19, 2004

(87) PCT Pub. No.: WO2004/028816
PCT Pub. Date: Apr. 8, 2004

(65) Prior Publication Data
US 2005/0071990 A1 Apr. 7, 2005

(30) Foreign Application Priority Data
Sep. 30, 2002 (JP) .............................. 2002-285992
Oct. 2, 2002 (JP) .............................. 2002-290369

(51) Int. Cl.
*H05K 3/30* (2006.01)
*B23P 21/00* (2006.01)
*B23Q 15/00* (2006.01)

(52) U.S. Cl. ............................ 29/834; 29/721; 29/740; 29/832; 29/833; 356/400; 356/401

(58) Field of Classification Search ................. 29/709, 29/712, 720, 721, 739–743, 832–834, 708; 356/399–401; 355/53; 901/46
See application file for complete search history.

(56) References Cited

U.S. PATENT DOCUMENTS

| | | | | |
|---|---|---|---|---|
| 4,755,053 A | * | 7/1988 | Levinson et al. | 356/400 |
| 5,177,528 A | * | 1/1993 | Koromegawa et al. | 355/53 |
| 6,389,688 B1 | * | 5/2002 | Srivastava et al. | 29/833 |
| 6,892,447 B1 | * | 5/2005 | Yamauchi et al. | 29/740 |

FOREIGN PATENT DOCUMENTS

| | | |
|---|---|---|
| JP | 03-187747 | 8/1991 |
| JP | 05-13735 | 1/1993 |
| JP | 07-36197 | 2/1995 |
| JP | 09-192970 | 7/1997 |

* cited by examiner

*Primary Examiner*—Minh Trinh
*Assistant Examiner*—Donghai D. Nguyen
(74) *Attorney, Agent, or Firm*—Sonnenschein Nath & Rosenthal LLP

(57) ABSTRACT

A first electronic component having two alignment holes perforated at predetermined positions thereof at a predetermined interval is held with a receiving table, and also a second electronic component having two alignment marks formed at predetermined positions thereon at an interval therebetween in agreement with that between the two alignment holes is held with a position-adjusting mechanism. In a state in which the alignment marks of the second electronic component are introduced in the corresponding alignment holes of the first electronic component, the mark-recognition apparatus captures the alignment marks and the alignment holes in the same fields of view thereof and measures the positions of the two components, and the position-adjusting mechanism adjusts the position of the second electronic component such that the alignment marks of the second electronic component lie at predetermined positions in the alignment holes of the first electronic component.

11 Claims, 15 Drawing Sheets

ELECTRONIC-COMPONENT ALIGNMENT METHOD AND APPARATUS THEREFOR

BACKGROUND OF THE INVENTION

The present invention relates to an electronic-component alignment method for aligning two electronic components with each other by using marking means formed in these electronic components and also to an apparatus therefor.

As shown in FIGS. 14 and 15, a known bonding apparatus for aligning a chip member with a plate-like or sheet-like board and then assembling therewith is formed by head-moving means 5 for driving a pressure head 4 disposed so as to be vertically movable along a guide 3 disposed on a side surface of a supporting member 2 disposed on a stand 1 in a standing manner; a pressing means 6 fixed to the head-moving means 5, for applying a predetermined load on the pressure head 4; a stage 7 disposed on the stand 1 so as to face the pressure head 4; and a mark-recognition apparatus 8 insertably disposed between the pressure head 4 and the stage 7.

The stage 7 is movable in the X and Y directions and rotatable in the θ direction by an X-axis driving source 12, a Y-axis driving source 13, and a θ-rotation driving source (not shown), respectively, and the head-moving means 5 is movable in the Z direction by a Z-axis driving source 14. Also, as shown in FIG. 16, the mark-recognition apparatus 8 has a structure in which a camera unit 8a has two cameras 8b and 8c horizontally juxtaposed therein in a state in which the optical axes of pickup lenses thereof agree with each other, and a double-face reflective mirror 8d whose both surfaces are parallel to each other and reflective is disposed at an angle of 45 degrees and between the cameras 8b and 8c (see, for example, Patent Document 1 (Japanese Unexamined Patent Application Publication No. 2000-94232 (page 4, FIG. 2))).

When a chip member 10 is aligned and assembled with a plate-like or sheet-like board 9 by the known bonding apparatus having the above-mentioned structure, in a state in which the head-moving means 5 and the pressure head 4 lie at the uppermost position, first the board 9 is placed on a placing portion 11 of the stage 7, and the chip member 10 is held on the lower surface of the pressure head 4.

Next, the mark-recognition apparatus 8 moves in the arrow A-direction indicated in FIG. 15 and is inserted between the board 9 and the chip member 10. With this arrangement, the mark-recognition apparatus 8 is ready to recognize alignment marks of the underlying board 9 and the overlying chip member 10 at the same time.

Then, the head-moving means 5 is lowered by driving the Z-axis driving source 14 in the above-described state and is stopped at a position where the alignment mark of the chip member 10 is clearly recognized by the mark-recognition apparatus 8. When the two alignment marks of the board 9 and the chip member 10 are recognized by the mark-recognition apparatus 8, control means 15 shown in FIGS. 14 and 15 moves the stage 7 by driving the X-axis driving source 12, the Y-axis driving source 13, and the θ-rotation driving source (not shown) so as to bring the two alignment marks of the board 9 and the chip member 10 in agreement with each other.

When the two alignment marks of the board 9 and the chip member 10 are brought into agreement with each other as mentioned above, and alignment of the board 9 and the chip member 10 with each other is completed, the mark-recognition apparatus 8 is retracted in the arrow B-direction indicated in FIG. 15, the pressing means 6 is activated for extending a pressing shaft 6a so as to press the pressure head 4 down, and the chip member 10 is closely attached on, assembled with, and bonded to the board 9.

However, in such a known bonding apparatus, since the alignment of the board 9 and the chip member 10 with each other is performed by the mark-recognition apparatus 8 inserted therebetween, the mark-recognition apparatus 8 requires a sufficient distance between the board 9 and the chip member 10 so as to be inserted therebetween.

As a result, as shown in FIGS. 17A and 17B, even when an alignment mark 9a of the board 9 and an alignment mark 10a of the chip member 10 are accurately aligned with each other as shown in FIG. 17A, after the alignment, the chip member 10 must be lowered a long distance in the arrow C-direction until coming into close contact with the board 9 as shown in FIG. 17B.

This causes a moving error due to unsatisfactorily accuracy of a mechanism for lowering the chip member 10, and, as shown in FIG. 17B, sometimes causes a misalignment δ of the alignment marks 9a and 10a of the board 9 and the chip member 10 with each other. Accordingly, sometimes the board 9 and the chip member 10 are not accurately aligned with each other.

Also, as shown in FIG. 16, a recognition error Δ and so forth between two images exist due to a difference in inclinations of the optical axes of the two cameras 8b and 8c and to a non-uniform thickness of the double-face reflective mirror 8d. Accordingly, sometimes the board 9 and the chip member 10 are not accurately aligned with each other. In order to achieve accurate alignment of, for example, 1 μm or less by correcting all these errors, an accurate correction-mechanism and a complicated mechanism-control are needed, thereby causing a risk that the apparatus becomes expensive.

SUMMARY OF THE INVENTION

It is an object of the present invention to provide an electronic-component alignment method and an apparatus therefor with which the above problems can be solved and two electronic components can be accurately aligned with each other such that a mark-recognition apparatus captures mutually corresponding alignment marking-means of the two components in the same fields of view thereof and measures the positions of the two components.

In order to achieve the above object, an electronic-component alignment method according to the present invention includes the steps of: holding a first electronic component with a receiving table, having two alignment holes perforated at predetermined positions thereof so as to be spaced away from each other by a predetermined interval, and holding a second electronic component with a position-adjusting mechanism, having two alignment marks formed at predetermined positions thereon so as to have an interval therebetween in agreement with that between the two aligning holes; capturing the alignment marks and the corresponding alignment holes in the same fields of view of a mark-recognition apparatus in a state in which the alignment marks of the second electronic component are introduced in the corresponding alignment holes of the first electronic component and measuring the positions of the two components; and adjusting the position of the second electronic component with the position-adjusting mechanism such that the alignment marks of the second electronic component lie at predetermined positions in the corresponding alignment holes of the first electronic component, whereby the two components are aligned with each other by performing the above steps.

With such a configuration, the first electronic component having the two alignment holes perforated at predetermined positions thereof so as to be spaced away from each other by a predetermined interval is held with the receiving table, and also the second electronic component having the two alignment marks formed at predetermined positions thereon so as to have an interval therebetween in agreement with that between the two alignment holes is held with the position-adjusting mechanism. Thus, in a state in which the alignment marks of the second electronic component are introduced in the corresponding alignment holes of the first electronic component, the mark-recognition apparatus captures the alignment marks and the alignment holes in the same fields of view thereof and measures the positions of the two components, and the position-adjusting mechanism adjusts the position of the second electronic component such that the alignment marks of the second electronic component lie at predetermined positions in the alignment holes of the first electronic component.

With this arrangement, the mark-recognition apparatus does not lie between the two electronic components to be aligned with each other, a moving distance of the second electronic component along which its position is adjusted is small, and no recognition errors of the images and the like occur since the mark-recognition apparatus captures images of the two electronic components in the same fields of view thereof and measures the positions of the two components, whereby the two components are accurately aligned with each other.

Also, the first and second electronic components are held such that the alignment holes and the alignment marks, respectively, of the first and second electronic components lie within the focal depth of lenses of the mark-recognition apparatus, whereby the mark-recognition apparatus focuses on both the alignment hole of the first electronic component and the corresponding alignment mark of the second electronic component so as to pick up them at the same time.

In addition, the position-adjusting mechanism allows the second electronic component to move and rotate in the X and Y directions and in the θ direction, respectively, on a horizontal plane, and also the entire position-adjusting mechanism is movable in the Z direction on a vertical plane, whereby the first and second electronic components are aligned with each other and are also bonded to each other.

Furthermore, the mark-recognition apparatus is equipped with two cameras having an interval therebetween in agreement with that between the two alignment holes of the first electronic component, whereby the positions of the two electronic components are measured at once with respect to the two alignment holes and are thus quickly aligned with each other.

Also, the mark-recognition apparatus is equipped with a camera laterally movable along the same distance as the interval between the two alignment holes of the first electronic component, thereby achieving a simple and compact mark-recognition apparatus.

In addition, the mark-recognition apparatus is equipped with two identical lenses disposed so as to have an interval therebetween in agreement with that between the two alignment holes of the first electronic component; and a camera disposed at the common position on the optical paths of the two lenses, whereby no mechanism for laterally moving the camera is needed, resulting in a simpler and more compact mark-recognition apparatus.

Also, an electronic-component alignment apparatus according to the present invention is equipped with a receiving table holding a first electronic component having two alignment holes perforated at predetermined positions thereof so as to be spaced away from each other by a predetermined interval; a position-adjusting mechanism holding a second electronic component which is disposed so as to face the receiving table and which has two alignment marks formed at predetermined positions thereon so as to have an interval therebetween in agreement with that between the two aligning holes; a mark-recognition apparatus which is disposed rearward of the receiving table and which, in a state in which the alignment marks of the second electronic component are introduced in the alignment holes of the first electronic component, captures the alignment marks and the corresponding alignment holes in the same fields of view thereof and measures the positions of the two components, whereby, by using images whose positions are measured by the mark-recognition apparatus, the two components are aligned with each other by adjusting the position of the second electronic component with the position-adjusting mechanism such that the alignment marks of the second electronic component lie at predetermined positions in the two alignment holes of the first electronic component.

With such a structure, the mark-recognition apparatus does not lie between the two electronic components to be aligned with each other, a moving distance of the second electronic component along which its position is adjusted is small, and, since images of the two electronic components are captured in the same fields of view of the mark-recognition apparatus and the positions of the two components are measured, no recognition errors of the images and the like occur, whereby the two components are accurately aligned with each other.

Also, the first and second electronic components are held such that the alignment holes and the alignment marks, respectively, of the first and second electronic components lie within the focal depth of lenses of the mark-recognition apparatus, whereby the mark-recognition apparatus focuses on both the alignment hole of the first electronic component and the corresponding alignment mark of the second electronic component as to pick up them at the same time.

Also, the position-adjusting mechanism allows the second electronic component to move and rotate in the X and Y directions and in the θ direction, respectively, on a horizontal plane, and also the entire position-adjusting mechanism is movable in the Z direction on a vertical plane, whereby the first and second electronic components are aligned with each other and are also bonded to each other.

Also, the mark-recognition apparatus is equipped with two cameras having an interval therebetween in agreement with that between the two alignment holes of the first electronic component, whereby the positions of the two electronic components are measured at once with respect to the two alignment holes and are thus quickly aligned with each other.

Also, the mark-recognition apparatus is equipped with a camera laterally movable along the same distance as the interval between the two alignment holes of the first electronic component, thereby achieving a simple and compact mark-recognition apparatus.

Also, the mark-recognition apparatus is equipped with two identical lenses disposed so as to have an interval therebetween in agreement with that between the two alignment holes of the first electronic component; and a camera disposed at the common position on the optical paths of the two lenses, whereby no mechanism for laterally moving the camera is needed, resulting in a simpler and more compact mark-recognition apparatus.

Also, in order to achieve an object of the present invention, an electronic-component alignment method according to the present invention includes the steps of: arranging a first electronic component and a second electronic component so as to face each other, the first component having a pair of alignment holes formed at predetermined positions thereof so as to be spaced away from each other by a predetermined interval, and the second component having round or polygonal alignment marks, each formed by a plurality of alignment markings having different sizes and concentrically arranged, formed so as to have an interval therebetween in agreement with that between the alignment holes; roughly adjusting the first and second electronic components by capturing the overall image of a small alignment marking of each alignment mark in the corresponding alignment hole so as to capture the overall image of a large alignment marking of the alignment mark in the corresponding alignment hole by using the small alignment marking; measuring an amount of position correction for aligning the alignment mark with the center of the corresponding alignment hole by using the large alignment marking or the large and small alignment markings; and finely adjusting the first and second electronic components so as to be aligned with each other by relatively moving the second electronic component by the amounts of position correction.

With such a method, of the plurality of alignment markings concentrically arranged so as to form each alignment mark of the second electronic component disposed so as to face the first electronic component, the overall image of the small alignment marking is captured in the corresponding alignment hole of the first electronic component, and the first and second electronic components are roughly aligned with each other by using the small alignment marking. Then, when the overall image of the large alignment marking of the alignment mark is captured in the corresponding alignment hole, an amount of position correction for aligning the alignment mark with the center of the corresponding alignment hole is measured by using the large alignment marking or the large and small alignment markings, and the first and second electronic components are finely adjusted so as to be aligned with each other by relatively moving the second electronic component by the amounts of position correction. Thus, lenient preliminary-alignment accuracy is allowed, and also the first and second electronic components are accurately aligned with each other.

Also, since the alignment mark is a concentrically formed round, edge noise of a digital image picked up by the mark-recognition apparatus is uniform regardless of the orientation of the alignment mark, thereby improving image-recognition accuracy.

Also, when the first electronic component is a nozzle member of a print head of an image-forming apparatus, and the second electronic component is a chip of the print head, the print head can be accurately aligned by aligning the alignment marks formed on the chip with the corresponding alignment holes formed in the nozzle members.

Also, when the chip is fabricated by forming a circuit on a substrate, the alignment marks are formed outside the region of the chip where the circuit is formed. Accordingly, the alignment marks can be accurately formed by using a semiconductor process.

DETAILED DESCRIPTION OF THE PRESENTLY PREFERRED EMBODIMENTS

Embodiments of the present invention will be described below with reference to the attached drawings.

Figure 1:
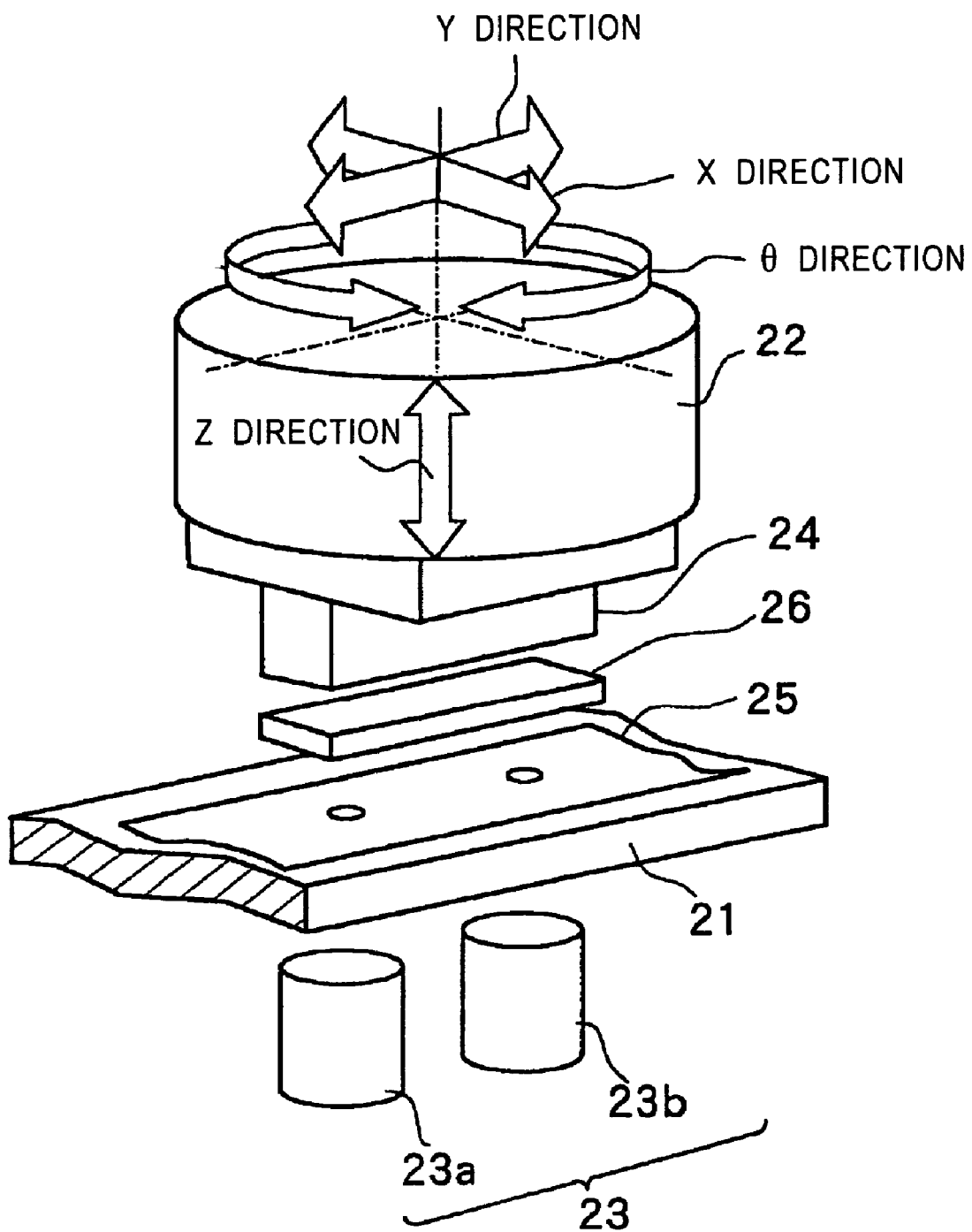
FIG. 1 is a schematic view illustrating a method for aligning electronic components according to an embodiment of the present invention.

FIG. 1 is a schematic view illustrating a method for aligning electronic components according to an embodiment of the present invention. With this electronic-component alignment method, two electronic components can be accurately aligned with each other such that a mark-recognition apparatus captures mutually corresponding alignment marking-means of the two components in the same fields of view thereof and measures the positions of the two components. As shown in FIG. 1, the method is performed by using an apparatus having a receiving table 21 of the one electronic component, a position-adjusting mechanism 22 of the other electronic component, and a mark-recognition apparatus 23.

Meanwhile, the reference numeral 24 denotes a bonding tool for bonding the two electronic components to each other.

In FIG. 1, in the first step, a first electronic component 25 is held with the receiving table 21, and also a second electronic component 26 is held with a position-adjusting mechanism 22. The first electronic component 25 is, for example, a board such as a printed circuit board or a glass board, or a nozzle member used for a print head of an image-forming apparatus such as an inkjet printer, and, as shown in FIG. 2A, is formed of a sheet-like member having two alignment holes 27a and 27b perforated at predetermined positions thereof so as to be spaced away from each other by a predetermined interval p.

Figure 2A:
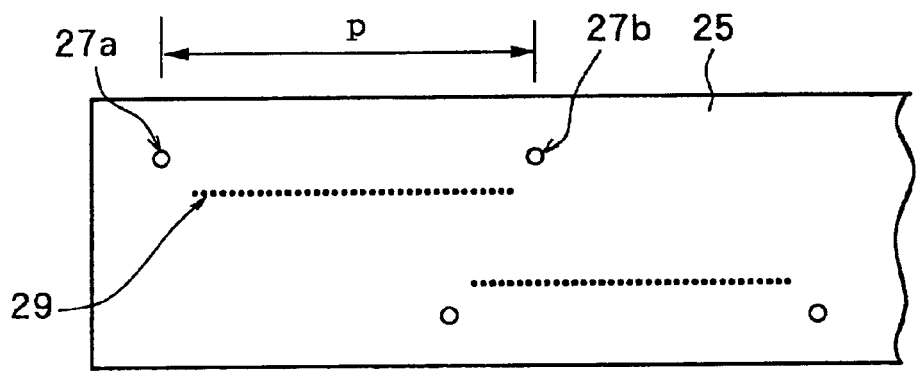
FIGS. 2A and 2B are plan views illustrating states in which alignment holes of a first electronic component and alignment marks of a second electronic component are formed.
Figure 2B:
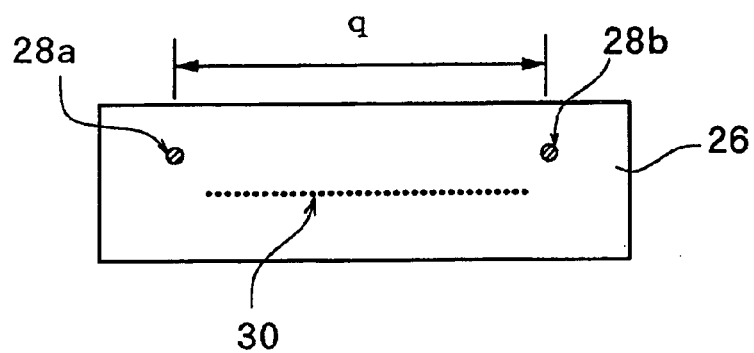

Also, the second electronic component 26 is, for example, an individual bare chip cut out from a semiconductor wafer, an IC (hereinafter, simply referred to as chip) used for a print head of an image-forming apparatus such as an inkjet printer, or the like, and, as shown in FIG. 2B, the chip has two alignment marks 28a and 28b formed at predetermined positions thereof so as to have a predetermined interval q therebetween in agreement with the interval p between the two alignment holes 27a and 27b.

In FIG. 2A, each of the alignment holes 27a and 27b is formed of a round hole having a diameter of about 50 to 60 μm. The reference numeral 29 denotes nozzles, each having a diameter of about 17 μm perforated in, for example, a nozzle member serving as the first electronic component 25, and the nozzles 29 are formed with an example pitch of about 42 μm. Also, in FIG. 2B, each of the alignment marks 28a and 28b is formed of a round mark having a diameter of about 20 μm. In addition, the reference numeral 30 denotes heaters, each about 20 μm in square size, formed in a printer-head chip serving as the second electronic component 26, for example, and the heaters 30 are formed with a pitch of an about 42 μm, the same as that of the nozzles 29.

Figure 3:
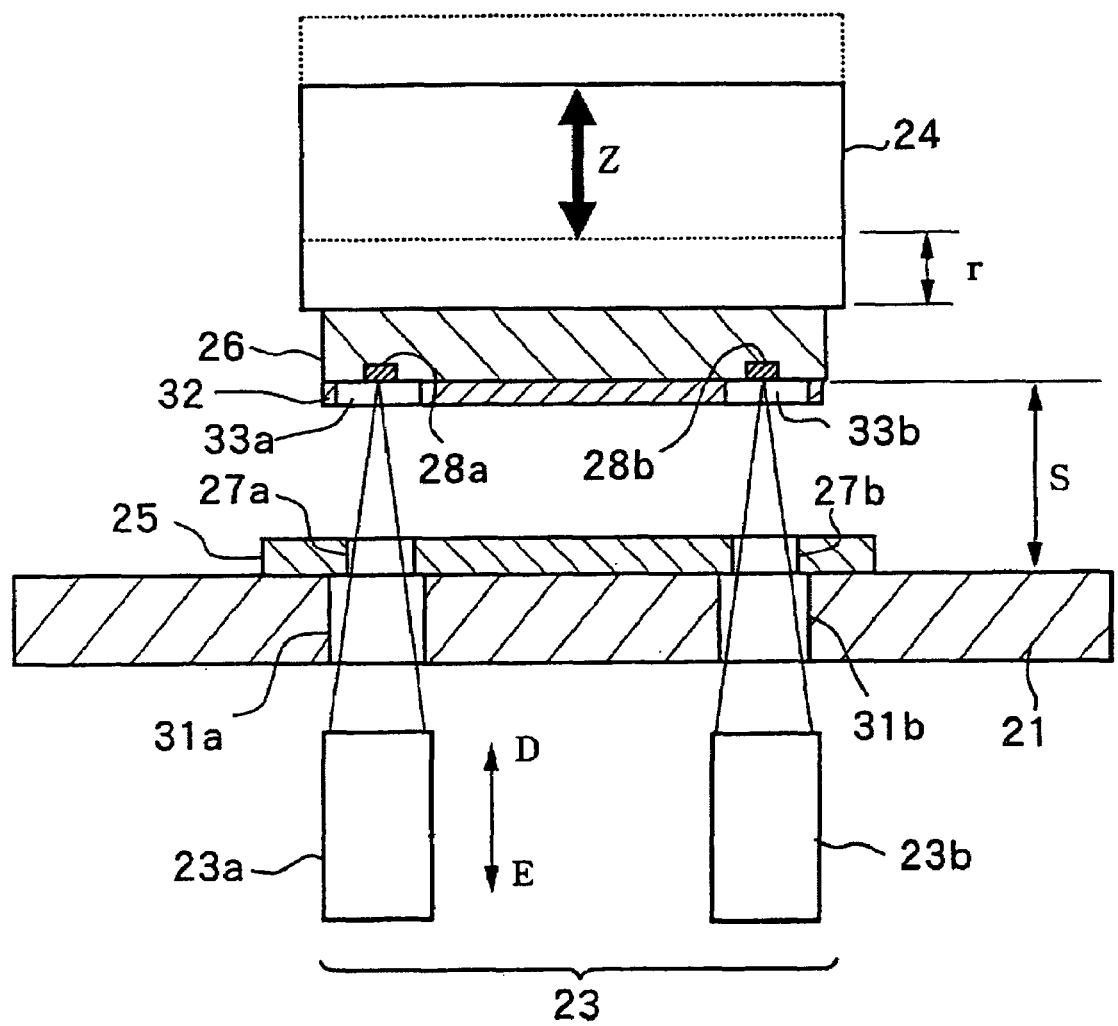
FIG. 3 is a sectional view illustrating a state in which, in a state in which the alignment marks of the second electronic component are introduced in the corresponding alignment holes of the first electronic component, a mark-recognition apparatus captures the alignment holes and the corresponding alignment marks in the same fields of view thereof and measures the positions of the two components.

The first electronic component 25 formed of the above-mentioned sheet-like member is adhered to, for example, a frame and is held with air suction through an air suction hole (not shown) formed in the receiving table 21. In this case, as shown in FIG. 3, portions of the receiving table 21 for placing the first electronic component 25 thereon and holding it therewith have two see-through holes 31a and 31b formed therein so as to correspond to the two alignment holes 27a and 27b of the first electronic component 25.

The see-through holes 31a and 31b are round holes having a diameter of, for example, about 400 μm so as to see through the alignment holes 27a and 27b clearly. Also, the receiving table 21 has heating means (not shown) such as a heater built therein so as to heat a portion of the first electronic component 25 coming into contact with the receiving table 21.

The second electronic component 26 is held with the position-adjusting mechanism 22 having the bonding tool 24 interposed therebetween. In this case, as shown in FIG. 3, it is held with air-suction through an air suction hole (not shown) formed in the bonding tool 24.

Thus, the bonding tool 24 moves up and down in the Z direction together with the position-adjusting mechanism 22 so as to form a chip-transfer gap r below the lower surface of the bonding tool 24. The bonding tool 24 has heating means (not shown) such as a heater built therein so as to heat the second electronic component 26 coming into contact with the bonding tool 24.

Also, the second electronic component 26 held with the bonding tool 24 has a dry-film resist 32 formed below the lower surface thereof, serving as an adhesive. Thus, portions of the dry-film resist 32 corresponding to the two alignment marks 28a and 28b of the second electronic component 26 have two see-through holes 33a and 33b formed therein.

As shown in FIG. 1, the position-adjusting mechanism 22 holding the second electronic component 26 having the bonding tool 24 interposed therebetween is designed so as to move and rotate the second electronic component 26 in the X and Y directions and in the θ direction, respectively, on a horizontal plane, and in addition, to be movable as a whole in the Z direction on a vertical plane in order to bond the first electronic component 25 and the second electronic component 26 to each other.

In this case, as shown in FIG. 3, an alignment gaps (for example, about 70 to 130 μm thick) for aligning the two electronic components is set between the upper surface of the receiving table 21 and the lower surface of the second electronic component 26.

In such a state and in the subsequent step, in a state in which the alignment marks 28a and 28b of the second electronic component 26 are introduced in the corresponding alignment holes 27a and 27b of the first electronic component 25, the mark-recognition apparatus 23 captures the two alignment marks and the corresponding alignment holes in the same fields of view thereof and measures the positions of the two components.

As shown in FIG. 3, the mark-recognition apparatus 23 has two cameras 23a and 23b having an interval therebetween in agreement with that between the two alignment holes 27a and 27b of the first electronic component 25. In other words, the cameras 23a and 23b are respectively disposed so as to correspond to the positions of the two see-through holes 31a and 31b formed in the receiving table 21. Each of these cameras 23a and 23b is formed by a lens used for a coaxial incident-light illumination and having a predetermined magnification (for example, of about 9) and a video camera or a CCD camera having a predetermined pixel density (for example, of about 400,000 pixels per a quarter inch).

The lenses of the cameras 23a and 23b have a predetermined focal depth, and the first and second electronic components 25 and 26 are held so that the alignment holes 27a and 27b and the corresponding alignment marks 28a and 28b lie within the above focal depth.

With this arrangement, in a state in which the cameras 23a and 23b are placed closer to the first electronic component 25 by adjusting their heights as shown by the arrows D and E, the alignment holes 27a and 27b of the first electronic component 25 and the alignment marks 28a and 28b of the second electronic component 26 can be picked up at the same time.

Figure 4:
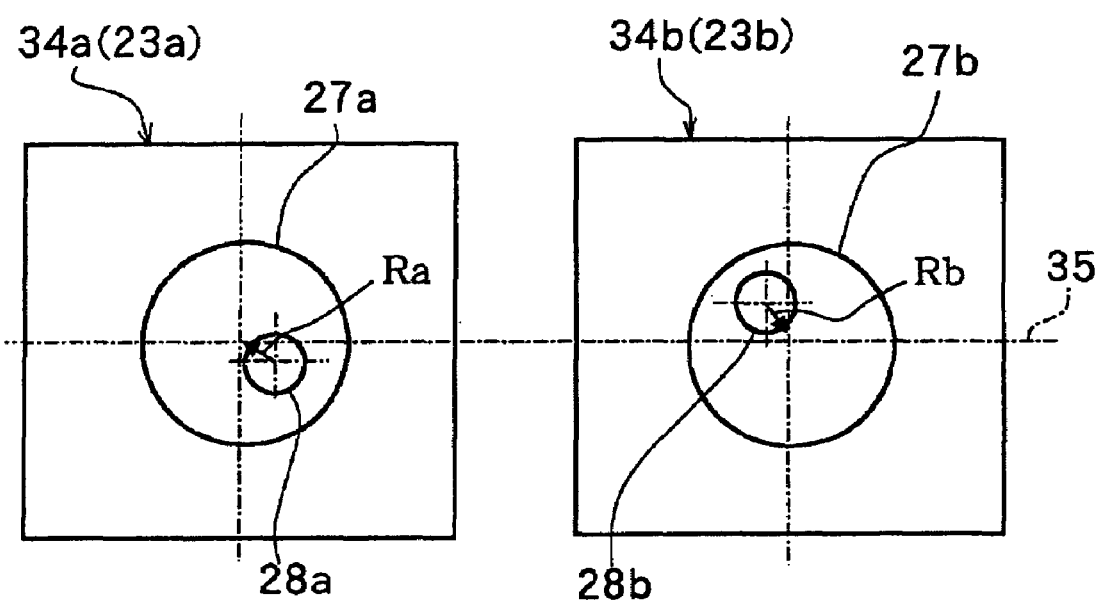
FIG. 4 is an illustration of position-measuring pictures of marking means captured by cameras of the mark-recognition apparatus in the same fields of view thereof.

As shown in FIG. 4, in this state, for example, an image lying in a state in which the one alignment mark 28a of the second electronic component 26 is introduced in the one alignment hole 27a of the first electronic component 25 is obtained in the field of view of the left camera 23a so as to serve as a picture 34a picked up by the left camera 23a, and an image lying in a state in which the other alignment mark 28b of the second electronic component 26 is introduced in the other alignment hole 27b of the first electronic component 25 is obtained in the field of view of the right camera 23b so as to serve as a picture 34b picked up by the right camera 23b.

When such pickup images are obtained, these images are subjected to image processing by an image-processing apparatus (not shown) or the like, the center positions of the alignment holes 27a and 27b and those of the alignment marks 28a and 28b are respectively recognized in the two pictures 34a and 34b, and the center distance Ra between the one alignment hole 27a and alignment mark 28a and the center distance Rb between the other alignment hole 27b and alignment mark 28b are computed. FIG. 4 illustrates a position-measuring state in which the center positions of the alignment holes 27a and 27b are misaligned with the corresponding center positions of the alignment marks 28a and 28b.

In this state and in the following step, as shown in FIG. 4, the position-adjusting mechanism 22 adjusts the position of the second electronic component 26 such that the alignment marks 28a and 28b of the second electronic component 26 lie at predetermined positions in the two alignment holes 27a and 27b of the first electronic component 25.

Figure 6:
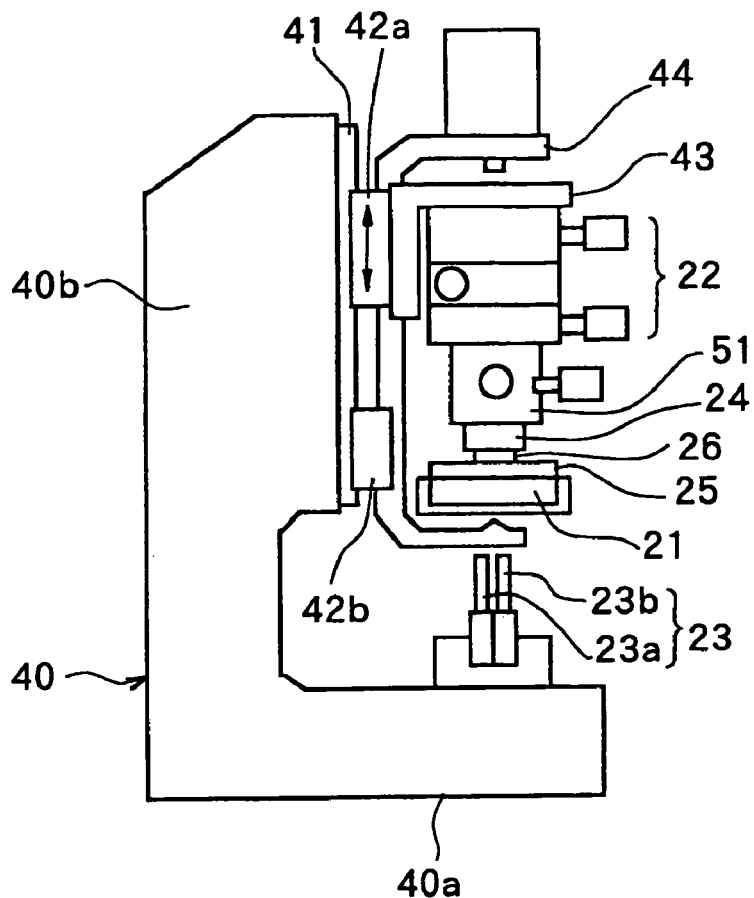
FIG. 6 is a side view of an electronic-component alignment apparatus according to an embodiment of the present embodiment.
Figure 7:
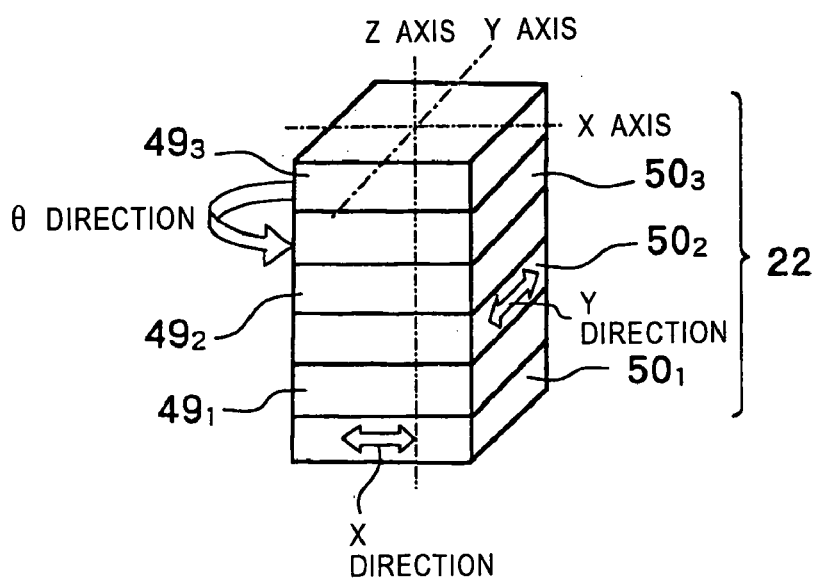
FIG. 7 is a perspective view illustrating the specific structure of a position-adjusting mechanism.

In other words, the position-adjusting mechanism 22 shown in FIGS. 6 and 7 is activated so as to align the two components with each other by moving and rotating the second electronic component 26 held with the position-adjusting mechanism 22 having the bonding tool 24 interposed therebetween, respectively, in the X and Y directions and in the θ direction in accordance with the center distances Ra and Rb if necessary, and ideally by bringing the centers of the one alignment hole 27a and alignment mark 28a in agreement with each other and also the centers of the other alignment hole 27b and alignment mark 28b in agreement with each other.

Although the predetermined interval p between the two alignment holes 27a and 27b of the first electronic component 25 and the predetermined interval q between the alignment marks 28a and 28b of the second electronic component 26 are formed so as to equal to each other in FIGS. 2A and 2B, dimensional errors take place actually in these components due to machining errors, temperature conditions, and so forth, whereby the centers of the mutually corresponding alignment holes and alignment marks are sometimes not brought into agreement with each other. In such a case, as shown in FIG. 4, the position of the second electronic component 26 can be adjusted such that the two alignment marks 28a and 28b are placed on a center line 35 connecting the centers between the two alignment holes 27a and 27b so as to be symmetrical with respect to each other.

Figure 5A:
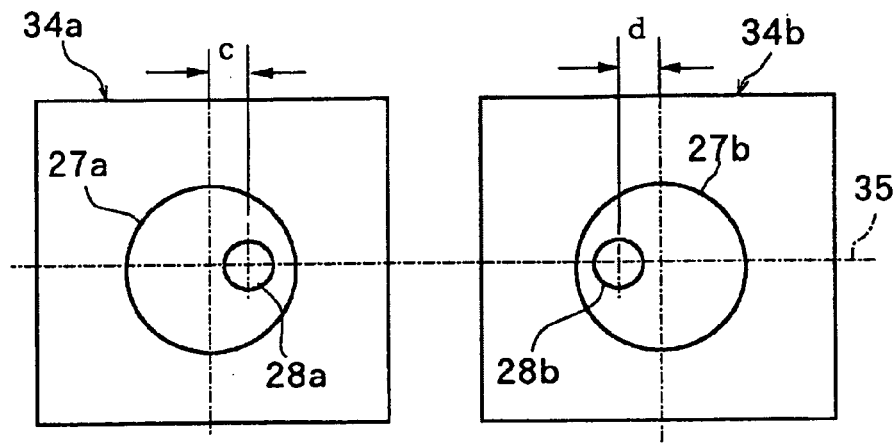
FIGS. 5A and 5B are illustrations of states in which the position of the second electronic component is adjusted by using the position-measuring pictures captured by the cameras of the mark-recognition apparatus.

For example, FIG. 5A illustrates the case where the relationship p>q exists due to the above-mentioned dimensional errors. In this case, the two components can be adjusted with each other by moving the second electronic component 26 in the Y direction, rotating it in the θ direction, and also moving it in the X direction so as to make misalignments c and d lying on the center line 35 equal to each other, respectively, between the centers of the alignment hole 27a and the alignment mark 28a in the picture 34a picked up by the left camera 23a and between the centers of the alignment hole 27b and the alignment mark 28b in the picture 34b picked up by the right camera 23b, and thus by adjusting the position of the second electronic component 26 such that the two alignment marks 28a and 28b are placed so as to be symmetrical with respect to each other.

Figure 5B:
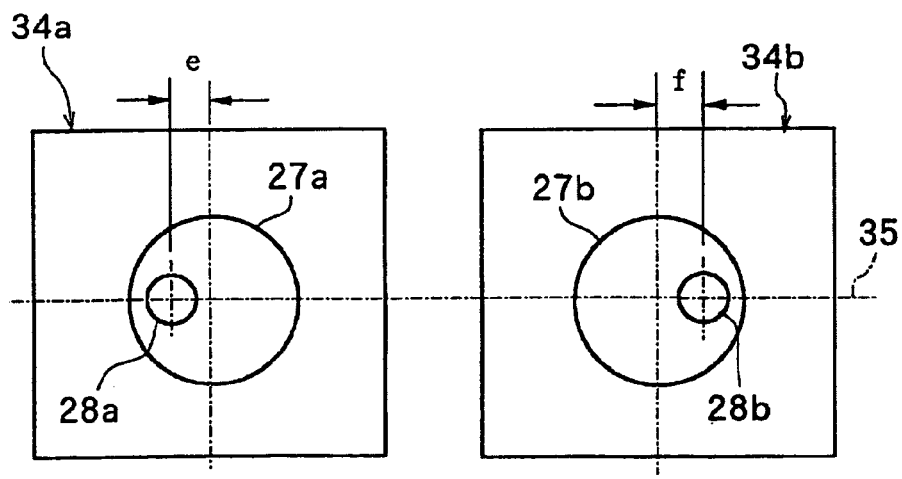

Meanwhile, FIG. 5B illustrates a state in which the relationship p<q exists due to the above-mentioned dimensional errors. In this case, the two components can be aligned with each other by moving the second electronic component 26 in the Y direction, rotating it in the θ direction, and also moving it in the X direction so as to make misalignments e and f lying on the center line 35 equal to each other, respectively, between the centers of the alignment hole 27a and the alignment mark 28a in the picture 34a picked up by the left camera 23a and between the centers of the alignment hole 27b and the alignment mark 28b in the picture 34b picked up by the right camera 23b, and by adjusting the position of the second electronic component 26 such that the two alignment marks 28a and 28b are placed so be symmetrical with respect to each other.

As described above, the two electronic components 25 and 26 can be aligned with each other such that, in a state in which the alignment marks 28a and 28b of the second electronic component 26 are introduced in the corresponding alignment holes 27a and 27b of the first electronic component 25, the mark-recognition apparatus 23 captures the two alignment marks and the corresponding alignment holes in the same fields of view thereof and measures the positions of the two components and also such that the position-adjusting mechanism 22 adjusts the position of the second electronic component 26 so as to place the alignment marks 28a and 28b of the second electronic component 26 at predetermined positions in the corresponding alignment holes 27a and 27b of the first electronic component 25.

With this arrangement, the mark-recognition apparatus 23 does not lie between the two electronic components 25 and 26 to be aligned with each other, a moving distance of the second electronic component 26 along which its position is adjusted is small, and no recognition errors of the images and the like occur since the mark-recognition apparatus 23 captures images of the two electronic components 25 and 26 in the same fields of view thereof and measures the positions of the two components, whereby the two components are accurately aligned with each other, for example, within an accuracy of 1 μm.

In the meantime, the present invention is not limited to a configuration in which the position of the second electronic component is adjusted so that the two alignment marks 28a and 28b are placed so as to be symmetrical with respect to each other on the center line 35 connecting the two alignment holes 27a and 27b as shown in FIGS. 5A and 5B, and it is also applicable to another configuration in which the two components are aligned with each other by adjusting the second component so as to be placed at another predetermined position.

Next, an electronic-component alignment apparatus according to the present invention related to the above-described electronic-component alignment method will be described with reference to FIGS. 6 to 8. With this electronic-component alignment apparatus, the two electronic components can be accurately aligned with each other such that the mark-recognition apparatus captures mutually corresponding alignment marking-means of the two components in the same fields of view thereof and measures the positions of the two components. As shown in FIG. 6, the alignment apparatus is formed by the receiving table 21, the position-adjusting mechanism 22, the mark-recognition apparatus 23, and a stand 40. The reference numerals 25 and 26 respectively denote first and second electronic components.

The stand 40 serves as a base for fixing and supporting a major part of the electronic-component alignment apparatus according to the present invention thereto and thereby and is formed by a horizontal stand member 40a and a vertical supporting member 40b. The vertical supporting member 40b has a guide member 41 formed on one side surface thereof and extending in the vertical direction, and the guide member 41 has two moving blocks 42a and 42b disposed thereon so as to be vertically movable. The upper moving block 42a has an overhanging arm 43 fixed thereto and protruding horizontally. Also, the lower moving block 42b has a clamp press-bonding mechanism 44 fixed thereto, for bonding the two electronic components to each other.

Figure 8:
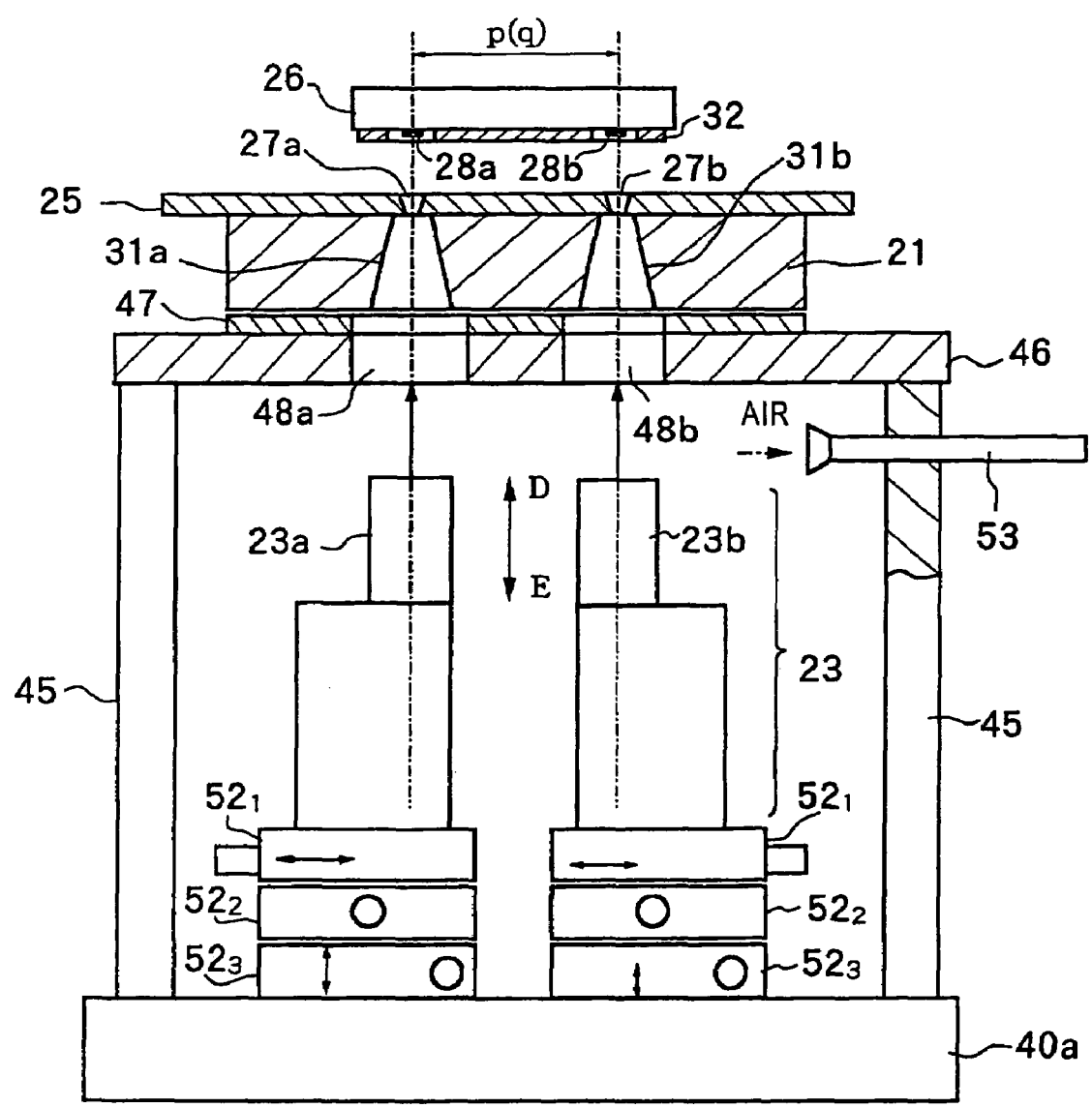
FIG. 8 is a magnified illustration of major parts of a receiving table for receiving the first electronic component, the mark-recognition apparatus, and so forth.

As shown in FIG. 8, the horizontal stand member 40a has two longitudinal supporting beams 45 disposed at both lateral sides of the mark-recognition apparatus 23 in a standing manner; a lateral supporting beam 46 stretched over the tops of the two longitudinal supporting beams 45; and the receiving table 21 supported on the upper surface of the lateral supporting beam 46 having an insulating material 47 interposed therebetween. The receiving table 21 is intended to hold the first electronic component 25, having the same structure as that shown in FIG. 3. Accordingly, each of the lateral supporting beam 46 and the insulating material 47 has through-holes 48a and 48b perforated therein at positions in agreement with those of the two see-through holes 31a and 31b formed in the receiving table 21.

The first electronic component 25 held with the receiving table 21 is, for example, a board such as a printed circuit board or a glass board, or a nozzle member used for a print head of an image-forming apparatus such as an inkjet printer and, as shown in FIG. 2A, is formed of a sheet-like member having the two alignment holes 27a and 27b perforated at predetermined positions thereof so as to be spaced away from each other by the predetermined interval p.

As shown in FIG. 6, the overhanging arm 43 disposed on the one side of the vertical supporting member 40b so as to be vertically movable, having the moving block 42a interposed therebetween, has the position-adjusting mechanism 22 supported below the lower surface thereof. The position-adjusting mechanism 22 is intended to hold the second electronic component 26 and disposed so as to face the receiving table 21.

The second electronic component 26 is, for example, an individual bare chip cut out from a semiconductor wafer or an IC used for a print head of an image-forming apparatus such as an inkjet printer, and, as shown in FIG. 2B, the chip has the two alignment marks 28a and 28b formed at predetermined positions thereof so as to have the predetermined interval q therebetween in agreement with the interval p between the two alignment holes 27a and 27b of the first component 25.

The position-adjusting mechanism 22 is designed so as to move and rotate the second electronic component 26 in the X and Y directions and in the $\theta$ direction, respectively, on a horizontal plane, and, as shown in FIG. 7, has a structure in which a first plate $49_1$, a second plate $49_2$, and a third plate $49_3$ are fixed every other plate so as to have a first slider 50, movable in the X direction, a second slider $50_2$ movable in the Y direction, and a third slider $50_3$ rotatable in the $\theta$ direction inserted therebetween, thereby allowing the mechanism to be movable in the X and Y directions and rotatable in the $\theta$ direction as a whole.

Also, since the position-adjusting mechanism 22 is supported below the lower surface of the overhanging arm 43 disposed so as to be vertically movable on the one side surface of the vertical supporting member 40b having the moving block 42a interposed therebetween, it is movable as a whole in the Z direction on a vertical plane, thereby bonding the first and second electronic components 25 and 26 to each other.

In this case, as shown in FIG. 6, the position-adjusting mechanism 22 has a tool-parallelism-adjusting mechanism 51 and the bonding tool 24 disposed below the under surface thereof, and the second electronic component 26 is held with air suction through an air suction hole (not shown) formed in the bonding tool 24.

The receiving table 21 has the mark-recognition apparatus 23 disposed rearward thereof. In a state in which the alignment marks 28a and 28b of the second electronic component 26 are introduced in the corresponding alignment holes 27a and 27b of the first electronic component 25, this mark-recognition apparatus 23 captures the two alignment marks and the corresponding alignment holes in the same fields of view thereof and measures the positions of the components. As shown in FIG. 8, the two cameras 23a and 23b are disposed below the receiving table 21 and on the horizontal stand member 40a so as to have an interval therebetween in agreement with that between the two alignment holes 27a and 27b of the first electronic component 25.

In other words, the cameras 23a and 23b are respectively disposed so as to correspond to the positions of the two see-through holes 31a and 31b formed in the receiving table 21. Each of these cameras 23a and 23b is formed by a lens used for a coaxial incident-light illumination and having a predetermined magnification (for example, of about 9) and a video camera or a CCD camera having a predetermined pixel density (for example, of about 400,000 pixels).

The lenses of the cameras 23a and 23b have a predetermined focal depth and the first and second electronic components 25 and 26 are held so that the alignment holes 27a and 27b and the corresponding alignment marks 28a and 28b lie within the above focal depth. With this arrangement, in a state in which the cameras 23a and 23b are placed closer to the first electronic component 25 by adjusting their heights as shown by the arrows D and E, the alignment holes 27a and 27b of the first electronic component 25 and the alignment marks 28a and 28b of the second electronic component 26 can be picked up at the same time.

In the meantime, as shown in FIG. 8, the horizontal stand member 40a has position-adjusting tables disposed thereon for having the two cameras 23a and 23b mounted thereon, each formed of a combination of an X-direction slider $52_1$, a Y-direction slider $52_2$, and a Z-direction slider $52_3$. Thus, the position-adjusting tables are intended to set the initial positions of the respective cameras 23a and 23b by moving them in the X, Y and Z directions so as to capture the corresponding alignment holes 27a and 27b of the first electronic component 25 within the fields of view thereof. Once the initial positions of the cameras 23a and 23b are set, the positions may be fixed thereafter.

Also, as shown in FIG. 8, the front surfaces of the two cameras 23a and 23b and the lateral supporting beam 46 have a predetermined gap formed therebetween and have an air duct 53 fixed in the gap and extending in the horizontal direction. The air duct 53 is intended to suck air around the cameras 23a and 23b in order to prevent fluctuation of pickup images caused by air convection due to heat around the cameras 23a and 23b. The air suction of the air duct 53 allows the cameras 23a and 23b to be cooled at the same time. Meanwhile, under certain circumstances around the cameras 23a and 23b, cold air may be blown from the air duct 53.

Next, the way of use and an operation of the electronic-component alignment apparatus having the above-described structure will be described. Basically the electronic-component alignment apparatus operates in the same process as that of the electronic-component alignment method described with reference to FIGS. 1 to 5B.

Firstly, in FIGS. 1 and 6, the first electronic component 25 is held with the receiving table 21, and also the second electronic component 26 is held with the position-adjusting mechanism 22. In this state, as shown in FIG. 3, it is desirable that the axial lines of the two alignment holes 27a and 27b of the first electronic component 25 extend substantially in line with those of the two alignment marks 28a and 28b of the second electronic component 26, and the alignment marks 28a and 28b of the second electronic component 26 are introduced in the corresponding alignment holes 27a and 27b of the first electronic component 25 so as to be seen therethrough.

Then, in a state in which the alignment marks 28a and 28b of the second electronic component 26 are introduced in the corresponding alignment holes 27a and 27b of the first electronic component 25, the mark-recognition apparatus 23 captures the two alignment marks and the corresponding alignment holes in the same fields of view thereof and measures the positions of the two components. In this state, the lenses of the cameras 23a and 23b have a predetermined focal depth, and the first and second electronic components 25 and 26 are held so that the alignment holes 27a and 27b and the corresponding alignment marks 28a and 28b lie within the above focal depth.

As shown in FIG. 4, in this state, for example, an image in a state in which the one alignment mark 28a of the second electronic component 26 is introduced in the one alignment hole 27a of the first electronic component 25 is obtained in the field of view of the left camera 23a so as to serve as the picture 34a picked up by the left camera 23a, and an image in a state in which the other alignment mark 28b of the second electronic component 26 is introduced in the other alignment hole 27b of the first electronic component 25 is obtained in the field of view of the right camera 23b so as to serve as the picture 34b picked up by the right camera 23b.

When such pickup images are obtained, these images are subjected to image processing by an image-processing apparatus (not shown) or the like, the center positions of the alignment holes 27a and 27b and those of the alignment marks 28a and 28b are respectively recognized in the two pictures 34a and 34b, and the center distance Ra between the one alignment hole 27a and alignment mark 28a and the center distance Rb between the other alignment hole 27b and alignment mark 28b are computed.

FIG. 4 illustrates the position-measuring state in which the center positions of the alignment holes 27a and 27b are misaligned with the corresponding center positions of the alignment marks 28a and 28b.

Then, as shown in FIG. 4, the position-adjusting mechanism 22 adjusts the position of the second electronic component 26 such that the alignment marks 28a and 28b of the second electronic component 26 lie at predetermined positions in the two alignment holes 27a and 27b of the first electronic component 25.

In other words, the position-adjusting mechanism 22 shown in FIGS. 6 and 7 is activated so as to align the two components by moving and rotating the second electronic component 26 held with the position-adjusting mechanism 22 having the bonding tool 24 interposed therebetween in the X and Y directions and in the θ direction, respectively, in accordance with the center distances Ra and Rb if necessary, and ideally by bringing the centers of the one alignment hole 27a and alignment mark 28a in agreement with each other and also the centers of the other alignment hole 27b and alignment mark 28b in agreement with each other.

The remaining part of the process is the same as that of the foregoing adjustment method and will be therefore omitted.

In the above description, although the mark-recognition apparatus 23 is equipped with the two cameras 23a and 23b as shown in FIGS. 1, 3, and 8, the present invention is not limited to this structure, and it may be equipped with a camera laterally movable along the same distance as the interval p between the two alignment holes 27a and 27b of the first electronic component 25.

Figure 9:
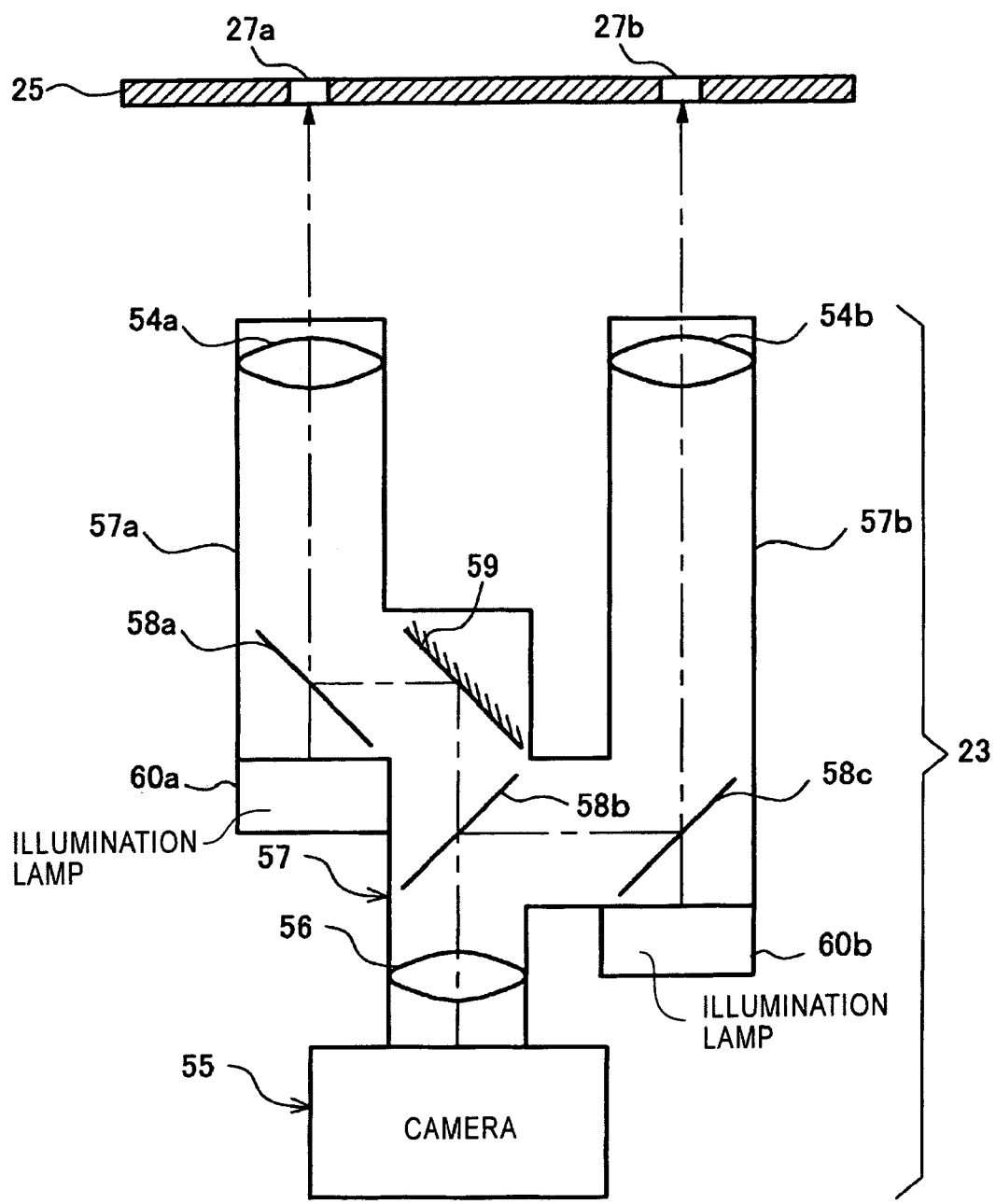
FIG. 9 is a magnified sectional view of a major part of a mark-recognition apparatus according to another embodiment.

Also, as shown in FIG. 9, the mark-recognition apparatus 23 may have two identical lenses 54a and 54b disposed so as to have an interval therebetween in agreement with that between the two alignment holes 27a and 27b of the first electronic component 25 and a camera 55 disposed at the common position on the optical paths of the two lenses 54a and 54b.

The two lenses 54a and 54b serve as objective lenses for capturing the two alignment holes 27a and 27b and the two alignment marks 28a and 28b (not shown) therethrough, respectively, and have the same depth of focus as each other. The camera 55 has another lens 56 serving as an image-forming lens disposed right in front thereof, and the two lenses 54a and 54b and the other lens 56 are fixed inside a bifurcated lens barrel 57 having a common root for the two lenses.

The first lens 54a and the camera 55 have a first half-mirror 58a, a total reflection mirror 59, and a second half-mirror 58b disposed on the optical path extending therebetween, the second lens 54b and the camera 55 have a third half-mirror 58c and the second half-mirror 58b (commonly used for both lenses 54a and 54b) disposed on the optical path extending therebetween, and the optical path between the first lens 54a and the camera 55 has the same length as that between the second lens 54b and the camera 55.

Meanwhile, of the bifurcated lens barrel 57, a lens barrel 57a close to the first lens 54a has a first illumination lamp 60a disposed at the bottom thereof, and a lens barrel 57b close to the second lens 54b has a second illumination lamp 60b disposed at the bottom thereof. Thus, the two alignment holes 27a and 27b as well as the two alignment marks 28a and 28b (not shown) can be illuminated by turning on the illumination lamps 60a and 60b, respectively.

With this structure, the mark-recognition apparatus 23 having the above structure may be used such that when either one of the first and second illumination lamps 60a and 60b is turned on by switching over therebetween, only the first lens 54a captures the one alignment hole 27a and alignment mark 28a in the same field of view thereof so as to measure the positions of these hole and mark, or only the second lens 54b captures the other alignment hole 27b and alignment mark 28b in the same field of view so as to measure the positions of these hole and mark.

Alternatively, the mark-recognition apparatus may be used such that the first and second illumination lamps 60a and 60b are turned on at the same time and such that, by using an image in which left and right pictures respectively picked up through the first and second lenses 54a and 54b overlap with each other, the right and left pictures are separated from each other and are then subjected to image processing so as to measure the positions of the two alignment holes 27a and 27b and the two alignment marks 28a and 28b.

Still alternatively, the mark-recognition apparatus may be used such that the first and second illumination lamps 60a and 60b are turned on at the same time, and left and right pictures are picked up while half the fields of view of the first and second lenses 54a and 54b are masked and such that, by using an image in which the left and right picked-up pictures overlap with each other, the right and left pictures are separated from each other and are then subjected to image processing so as to measure the positions of the two alignment holes 27a and 27b and the two alignment marks 28a and 28b.

Although each of the two alignment holes 27a and 27b of the first electronic component 25 and the alignment marks 28a and 28b of the second electronic component 26 is two-dimensionally round in the above description as shown in FIGS. 2B and 4, it may have another shape as long as its position is easily measured and its center is easily detected. In addition, the first electronic component 25 and the second electronic component 26 are not limited to a board and a chip, and they may be other appropriate electronic components.

Figure 10:
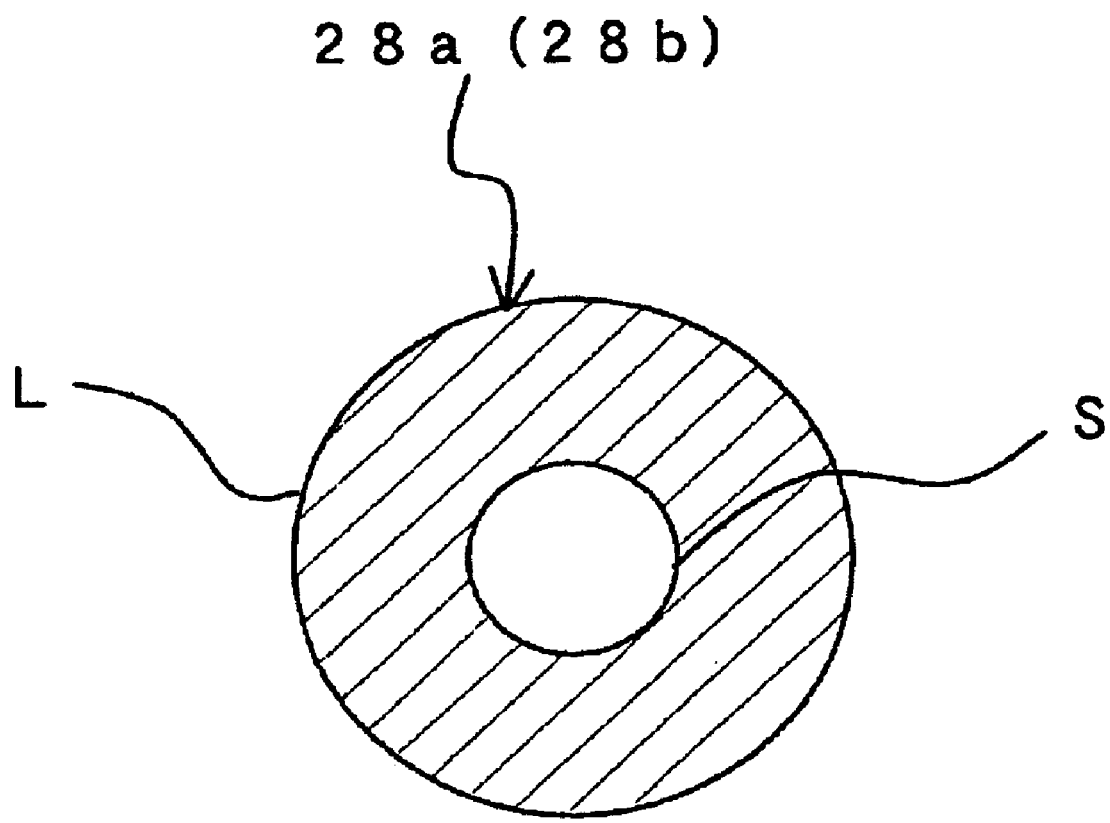
FIG. 10 is a plan view illustrating the shape of each alignment mark of the second electronic component according to another embodiment.

FIG. 10 is a plan view illustrating the shape of each alignment mark according to another embodiment. The same parts as in the above-described embodiment are denoted by the same reference numerals, and the description thereof will be omitted.

As shown in FIG. 3, each of the alignment marks 28a and 28b is formed such that two large and small circles are concentrically arranged so as to provide an outside diameter of about 30 μm and an inside diameter of about 15 μm. For example, it is provided by forming a small circle S by etching a central part of a large circle L formed of an aluminum thin film. In the meantime, of a plurality of alignment markings having different sizes and concentrically arranged so as to form a polygonal alignment mark, the large circle L represents a large alignment marking and the small circle S represents a small alignment marking.

Figure 11:
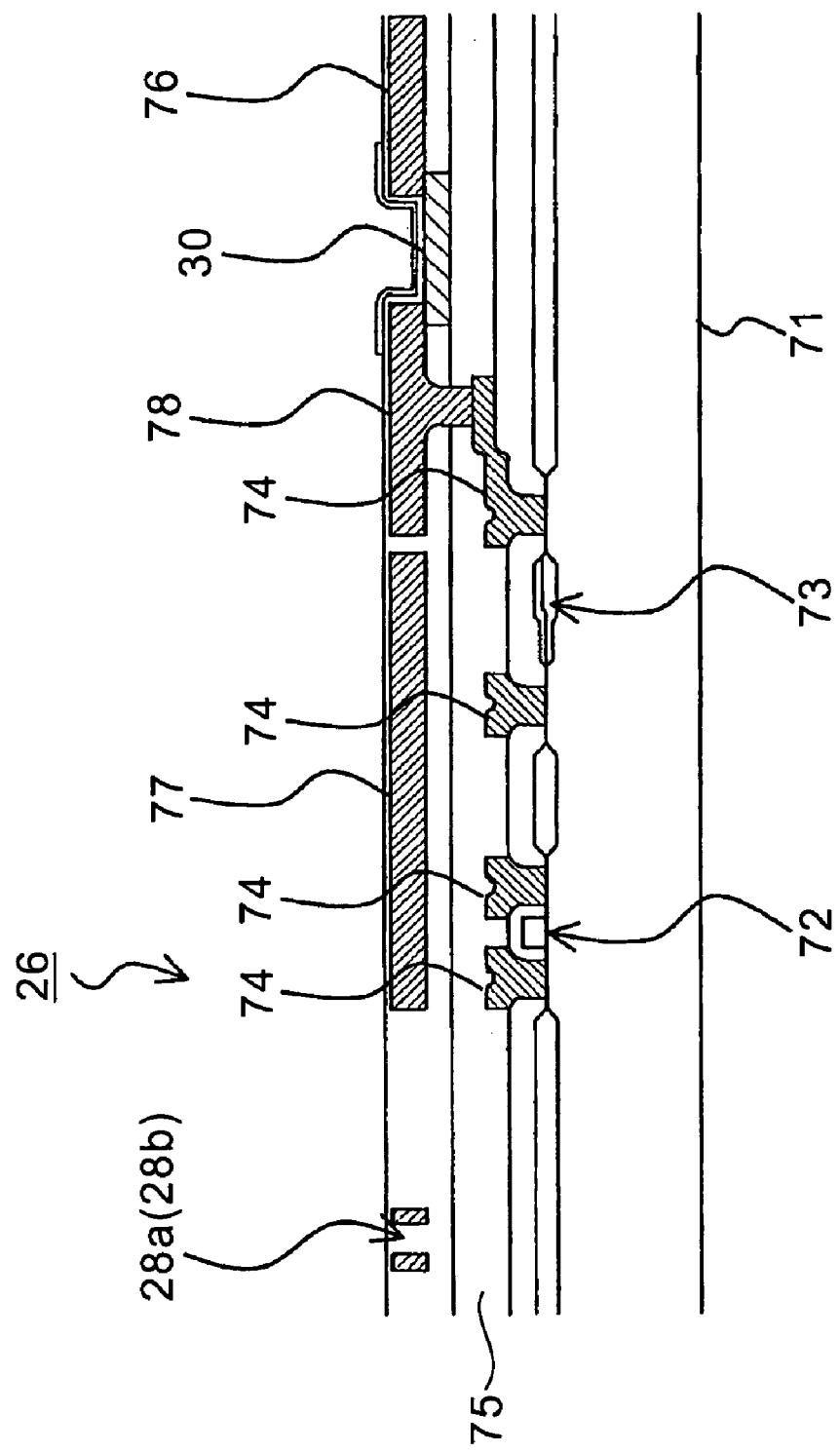
FIG. 11 is a schematic sectional view of a chip, illustrating the position where each alignment mark is formed.

To be more specific, as shown in FIG. 11, when a power-source wiring pattern 76, a ground-wiring pattern 77, and a second-layer wiring pattern of a wiring pattern 78 connecting a MOS driver-transistor 73 to the corresponding heater 30 are formed on the surface layer of a chip formed by sequentially laminating MOS (metal oxide semiconductor) transistors 72 and 73, a first-layer wiring pattern 74, and the heaters 30, having an interlayer insulating film 75 interposed thereamong, on a silicon substrate 71, each of the alignment marks 28a and 28b is formed at the same time by etching an aluminum thin film, outside the region of the chip where a circuit of the transistors and the like is formed.

As described above, each of the alignment marks 28a and 28b is formed so as to have a double circle having the large and small circles L and S because of the following reasons. A resolution of image processing generally has a positive correlation with the peripheral length of a recognized image. Accordingly, the large circle L having a large peripheral length has an advantage in high alignment accuracy. However, the larger the large circle L, the overall images of the large circles L of the alignment marks 28a and 28b are less likely to be captured in the corresponding alignment holes 27a and 27b at a preliminary alignment stage where the first and second electronic components 25 and 26 are placed at respectively predetermined positions, thereby leading to a disadvantage in requirement of higher accuracy for the preliminary alignment. On the other hand, although the small circle S having a small peripheral length leads to low alignment accuracy because of a low resolution of image processing, its small size leads to an advantage that the overall images of the small circles S are more likely to be captured in the corresponding alignment holes 27a and 27b at the preliminary alignment stage. Hence, the double circle is employed, taking the advantages of the large and small circles L and S into account.

To be more specific, for example, when each of the alignment holes 27a and 27b has a diameter of 60 μm, and each alignment mark is formed so as to have a single circle having a diameter of 20 μm, an accuracy required for the preliminary alignment is within ±20 μm with respect to each of the center distances between the alignment holes 27a and 27b and the corresponding alignment marks. Also, it is expected that an image-processing accuracy in this case is proportional to the square root of the peripheral length of each marking means, thus it is estimated that the ratio of image-processing accuracies in the above example case is 13.7 to 7.9.

On the other hand, when each of the alignment marks 28a and 28b according to the present invention is formed so as to have a concentric double circle with the large and small circles L and S having diameters of 30 μm and 15 μm, respectively, a preliminary-alignment accuracy is within ±22.5 μm with respect to each of the center distances between the small circles S of the alignment marks 28a and 28b and the corresponding alignment holes 27a and 27b, thereby leading to a more lenient requirement for the accuracy than in the case where each of the above-mentioned alignment marks is formed so as to have a single circle. Also, since the image-processing accuracy is determined by the ratio of the square root of the peripheral length of the large circle L of each of the alignment marks 28a and 28b to that of each of the alignment holes 27a and 27b, the ratio of the image-processing accuracies becomes 13.7 to 11.9, whereby the alignment accuracy between the alignment holes 27a and 27b and the corresponding alignment marks 28a and 28b is considerably improved.

Accordingly, by forming the alignment marks 28a and 28b so as to have a double circle, the overall images of the small circles S of the alignment marks 28a and 28b are highly likely to be captured in the corresponding alignment holes 27a and 27b. Also, when the electronic components 25 and 25 are roughly adjusted by using the small circles S so that the overall images of the large circles L are captured in the alignment holes 27a and 27b, and the overall images of the large circles L are resultantly captured, the alignment marks 28a and 28b are accurately aligned with the alignment holes 27a and 27b by finely adjusting the above electronic components by using the large circles L or both large and small circles L and S.

Figure 12:
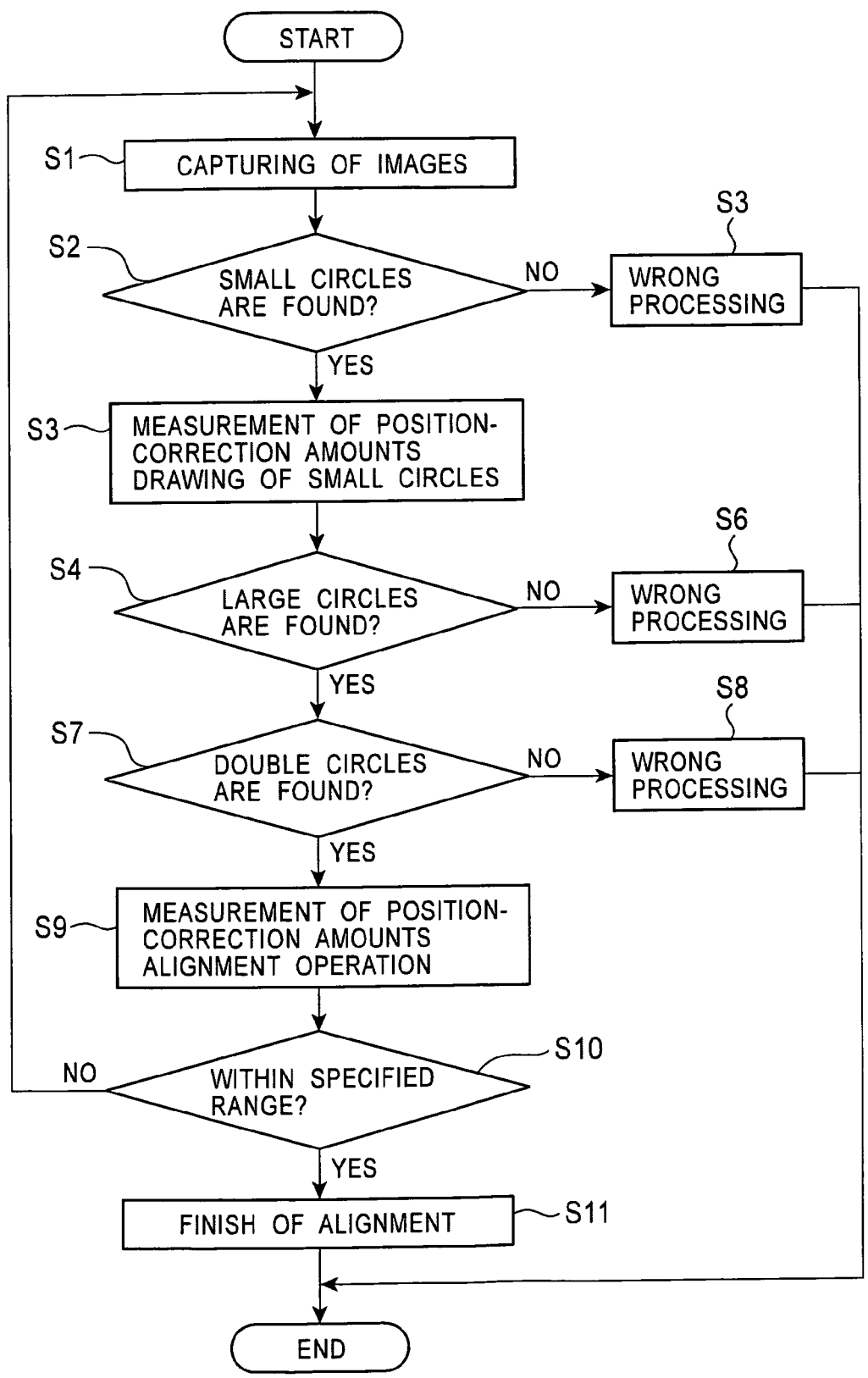
FIG. 12 is a flowchart illustrating the process of aligning the alignment marks with the corresponding alignment holes.

When both images of one of the alignment holes 27a and 27b of the first electronic component 25 and the corresponding one of the alignment marks 28a and 28b of the second electronic component 26 are recognized by the mark-recognition apparatus 23 as described above, the alignment holes 27a and 27b and the corresponding alignment marks 28a and 28b are aligned with each other in accordance with a processing procedure shown in FIG. 12.

First, in Step S1, images of the alignment holes 27a and 27b and the alignment marks 28a and 28b are captured by the mark-recognition apparatus 23. Then, in Step S2, the small circles S of the alignment marks 28a and 28b are searched in the corresponding alignment holes 27a and 27b. When the overall images of the small circles S are not found in the alignment holes 27a and 27b due to insufficient fixing accuracy of the second electronic component 26 with respect to the bonding tool 24, fractures of the alignment marks 28a and 28b, or the like, the process ends up wrong processing (in Step S3) and the alignment stage ends.

Then, the position-adjusting mechanism 22 shown in FIG. 1 moves up and, as shown in FIG. 3, forms the chip-transfer gap r below the lower surface of the bonding tool 24 so as to replace the second electronic component 26 with a new one. In the meantime, in Step S2, instead of being automatically searched as described above, the small circles S may be manually searched while the images thereof being visually observed in the corresponding alignment holes 27a and 27b.

Figure 13A:
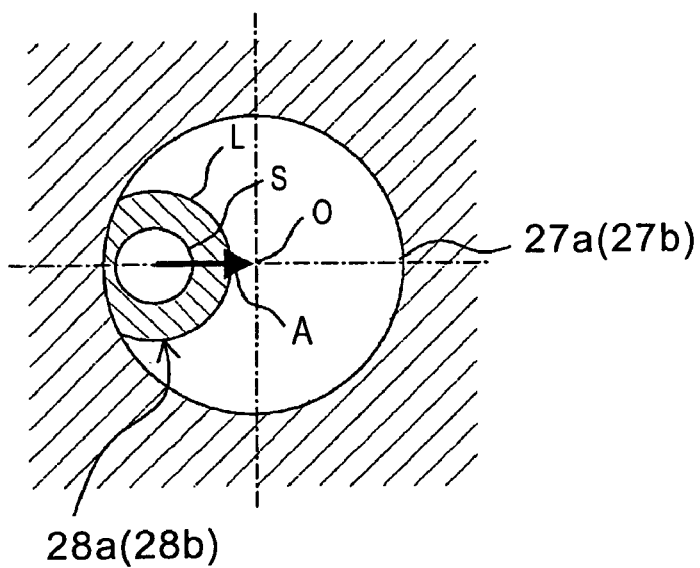
FIGS. 13A to 13C are illustrations of images of each alignment hole and the corresponding alignment mark recognized by the mark-recognition apparatus in the process illustrated in FIG. 11.

Meanwhile, when the overall images of the small circles S are recognized in Step S2 as shown in FIG. 13A, the process moves to Step S4, and amounts of position correction of the small circles S with respect to the center positions of the alignment holes 27a and 27b are measured by using the image of the small circles S.

Then, the second electronic component 26 is driven to move in the X or Y direction or to rotate in the θ direction by the position-adjusting mechanism 22 shown in FIG. 1, so that the small circles S of the alignment marks 28a and 28b are drawn in the arrow A-direction (see FIG. 13A) toward the centers O of the alignment holes 27a and 27b. With this arrangement, the first and second electronic components 25 and 26 are roughly adjusted (see FIG. 13B).

Next, the large circles L of the alignment marks 28a and 28b are searched in Step S5. When the overall images of the large circles L are not recognized in this step, for example, when the images of the corresponding small circles S are recognized in Step S2 based on false recognition of foreign particles, when misalignment between the center positions of the large and small circles L and S due to forming errors of the alignment marks 28a and 28b causes parts of the large circles L to lie behind the alignment holes 27a and 27b and to be invisible despite of the drawing operation of the small circles S in Step S4, and resultantly the large circles L not to be recognized as circles, or when system noise or the like causes the large circles L not to be recognized as circles, the process ends up wrong processing (in Step S6), and the alignment stage ends.

Then, the position-adjusting mechanism 22 shown in FIG. 1 moves up and, as shown in FIG. 3, forms the chip-transfer gap r below the lower surface of the bonding tool 24 so as to replace the second electronic component 26 with a new one.

Figure 13B:
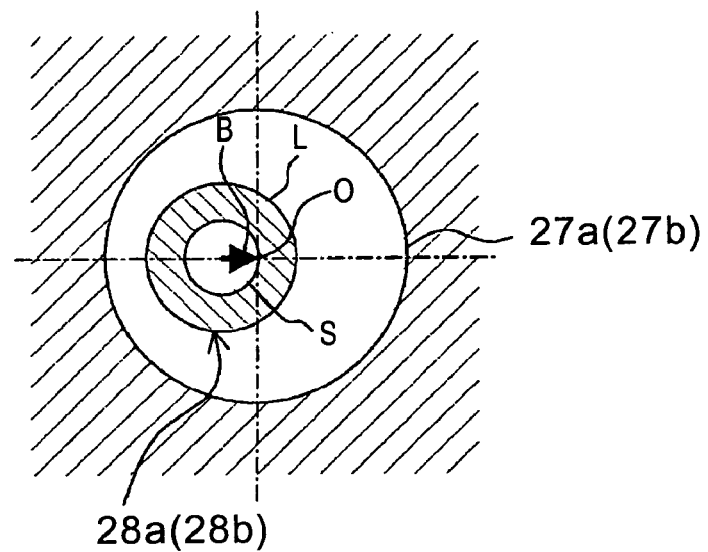

Also, as shown in FIG. 13B, when the overall images of the large circles L of the alignment marks 28a and 28b are recognized in Step S5, the process moves to Step S7, and it is determined whether or not each of the recognized alignment marks 28a and 28b forms a double circle. The criterion of determination about the double circle is based on whether or not the centers of the large and small circles L and S lie substantially in agreement with each other and these circles substantially form a concentric circle. When it is determined in Step S7 that each of the recognized alignment marks does not form a double circle, in other words, when the center positions of the large and small circles L and S are misaligned with each other due to forming errors of the alignment marks 28a and 28b as described above, the process ends up wrong processing (in Step S8), the alignment stage ends, and the second electronic component 26 is replaced with a new one in the same fashion as described previously.

On the other hand, when it is determined in Step S7 that each of the recognized alignment marks 28a and 28b forms a double circle, the process moves to Step S9, and the center distances between the alignment holes 27a and 27b and the corresponding alignment marks 28a and 28b are measured so as to compute amounts of position correction. For example, the amounts of position correction are measured on the basis of the large circles L of the alignment marks 28a and 28b or are provided as the mean values of respective amounts of correction measured on the basis of the large and small circles L and S of the alignment marks or as amounts of correction obtained by computing the ratio of the size of the large circle L to that of the small circle S and by weighting the respective amounts of correction in accordance with the computed ratio.

When the amounts of position correction are measured, the second electronic component 26 is driven to move in the X or Y direction or to rotate in the θ direction by the position-adjusting mechanism 22, so that the alignment marks 28a and 28b are respectively drawn in the arrow B-direction (see FIG. 13B) toward the centers O of the alignment holes 27a and 27b.

Figure 13C:
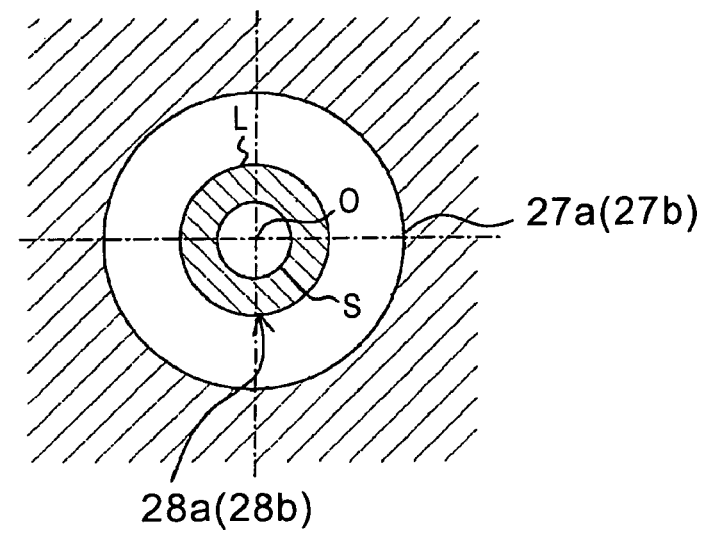
Figure 14:
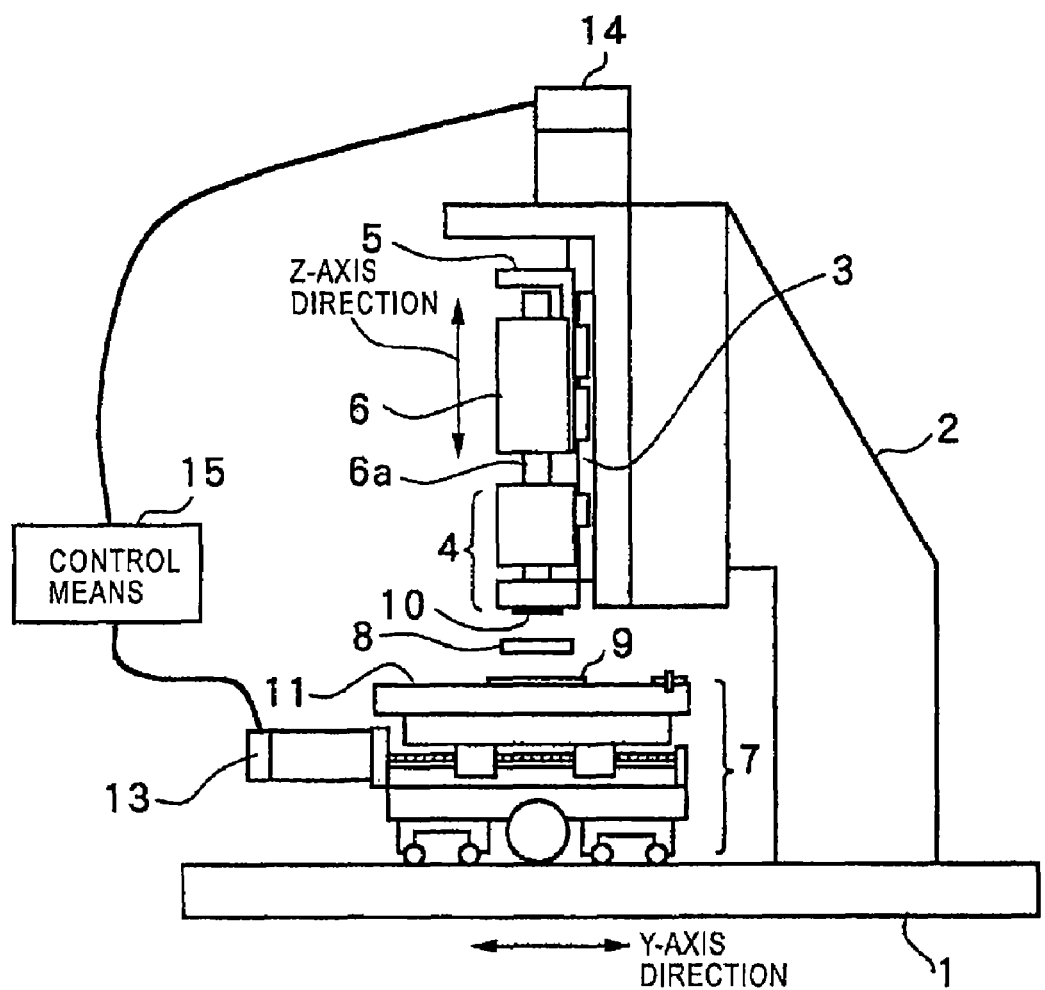
FIG. 14 is a side view of a known bonding apparatus.
Figure 15:
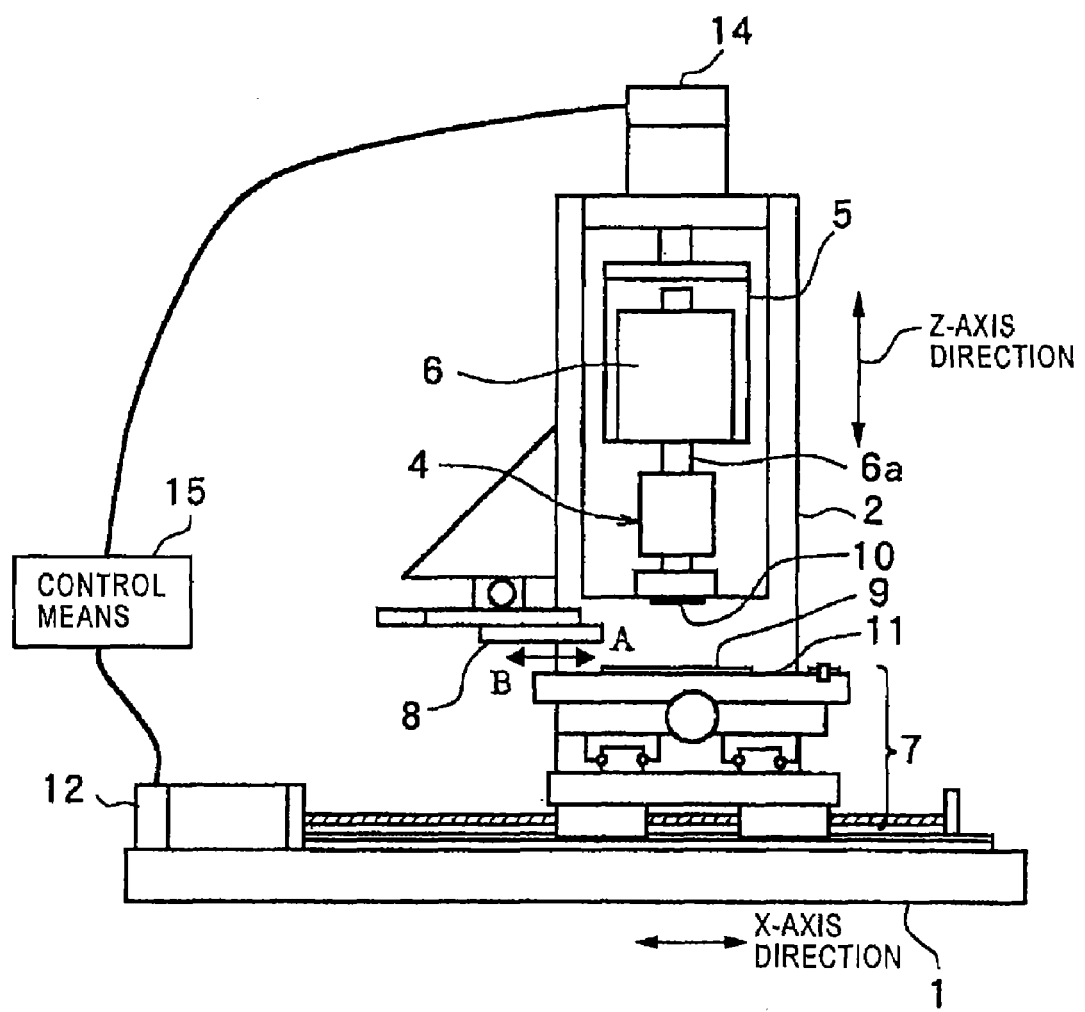
FIG. 15 is an elevational view of FIG. 14.
Figure 16:
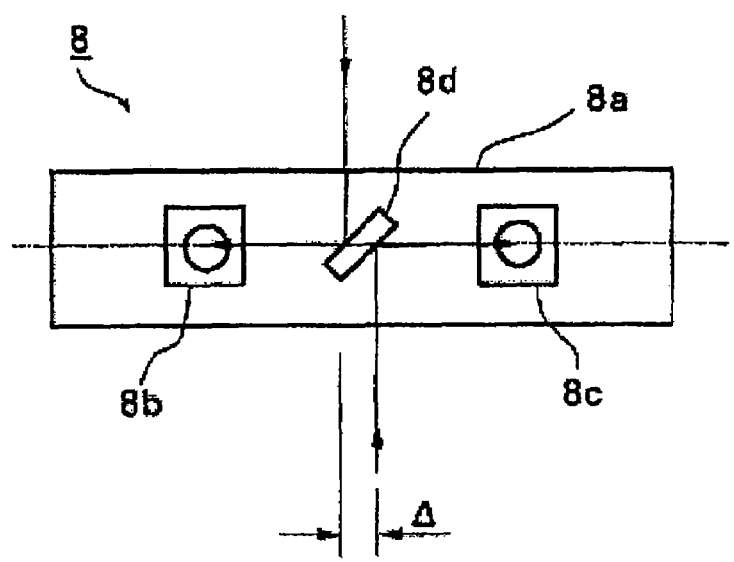
FIG. 16 is an illustration of a mark-recognition apparatus of the known bonding apparatus.
Figure 17A:
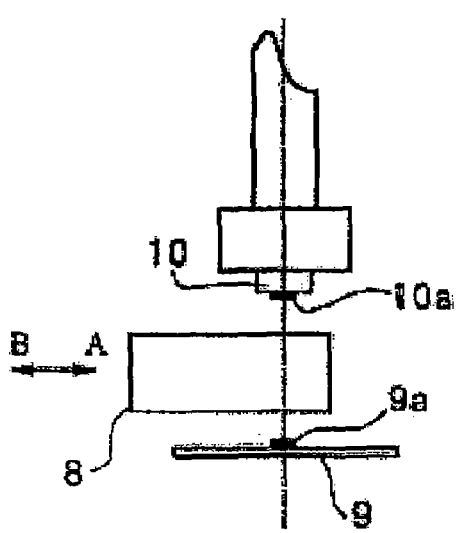
FIGS. 17A and 17B are illustrations of example misalignment between alignment marks of a board and a chip member of the known bonding apparatus.
Figure 17B:
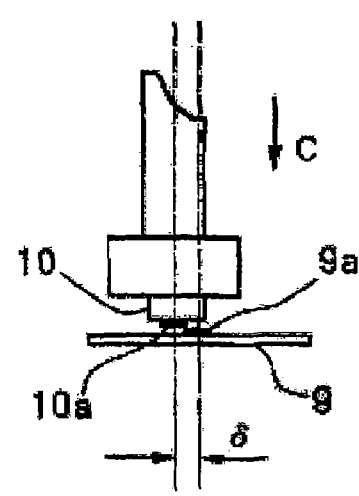

With this arrangement, the first and second electronic components 25 and 26 are finely adjusted such that the center positions of the alignment holes 27a and 27b and the corresponding alignment marks 28a and 28b are aligned with each other (see FIG. 13C). Meanwhile, when the intervals p and q, respectively, between the alignment holes 27a and 27b and between the alignment marks 28a and 28b shown in FIGS. 2A and 2B are not equal to each other due to a forming error of each marking means, a difference in thermal expansion of the two electronic components, or the like, the alignment holes 27a and 27b and the corresponding alignment marks 28a and 28b are aligned with each other so as to be symmetrical with respect to each other on the center line connecting the alignment holes 27a and 27b.

When fine adjustment for aligning the first and second electronic components 25 and 26 with each other is finished as described above, the process moves to Step S10, and it is determined whether or not misalignments of the center positions between the alignment holes 27a and 27b and the corresponding alignment marks 28a and 28b are within a specified value. When the misalignment between the alignment hole and the corresponding mark is within the specified value, the alignment is finished (in Step S11). When, the misalignment between the alignment hole and the alignment mark is out of the specified value, the alignment is performed by repeating Steps S1 to S10.

When the alignment is finished in accordance with the above-described processing procedure, the position-adjusting mechanism 22 shown in FIG. 1 moves down slowly, and the first and second electronic components 25 and 26 are assembled with each other. Then, heating means formed in the receiving table 21 and the bonding tool 24 are heated so as to bond the first and second electronic components 25 and 26 to each other, having the dry-film resist 32 disposed on the bonding surface of the second electronic component 26 interposed therebetween.

In accordance with the above-described electronic-component alignment method, since each of the alignment marks 28a and 28b is formed so as to have a double circle with large and small circles, at the preliminary alignment stage of the first and second electronic components 25 and 26, the overall images of the small circles S of the alignment marks 28a and 28b are easily captured in the alignment holes 27a and 27b, respectively, thereby leading to lenient preliminary-alignment accuracy. Accordingly, when amounts of position correction are measured by using the small circles S captured in the alignment holes 27a and 27b, and the alignment marks 28a and 28b are roughly adjusted with respect to the corresponding alignment holes 27a and 27b, the overall images of the large circles L of the alignment marks 28a and 28b can be easily drawn in the alignment holes 27a and 27b, respectively. With this arrangement, when the amounts of position correction for aligning the alignment marks 28a and 28b with the centers of the alignment holes 27a and 27b are measured by using the large circles L or both large and small circles L and S, and the alignment marks 28a and 28b are finely adjusted with respect to the alignment holes 27a and 27b, the first and second electronic components 25 and 26 can be accurately aligned with each other.

Also, since each of the alignment marks 28a and 28b is formed so as to have a double circle, even when foreign particles are falsely recognized as the small circles S, the false recognition can be corrected as long as the corresponding large circles L are not found outside the corresponding small circles S, thereby improving the recognition accuracy of each alignment mark.

In the meantime, each of the alignment marks 28a and 28b is not limited to a double circle, and it may be formed of three or more concentrically arranged circles. Also, each of the alignment holes 27a and 27b and the alignment marks 28a and 28b are not limited to a round shape, and it may have a rectangular shape, a triangular shape, or the like. Nevertheless, it is preferable that each marking means have a round shape since edge noise of a digital image picked up by the mark-recognition apparatus 23 is uniform regardless of its orientation.

INDUSTRIAL APPLICABILITY

The present invention is applicable to, for example, a bonding apparatus for aligning and assembling a chip member with a plate-like or sheet-like board.

The invention claimed is:

1. An electronic-component alignment method, comprising the steps of:
holding a first electronic component with a receiving table, having two unobstructed alignment holes perforated at predetermined positions thereof so as to be spaced away from each other by a predetermined interval, and holding a second electronic component with a position-adjusting mechanism, having two alignment marks formed at predetermined positions thereon so as to have an interval therebetween in agreement with that between the two aligning holes;
capturing the alignment marks and the corresponding alignment holes in the same fields of view of a mark-recognition apparatus in a state in which the alignment marks of the second electronic component are visually unobstructed within the corresponding alignment holes of the first electronic component, and measuring the positions of the two components; and
adjusting the position of the second electronic component with the position-adjusting mechanism such that the alignment marks of the second electronic component lie at predetermined positions in the corresponding alignment holes of the first electronic component,
wherein the two components are aligned with each other by performing the above steps,
wherein the position-adjusting mechanism moves and rotates the second electronic component in the X and Y directions and in the θ direction, respectively, on a horizontal plane, and
wherein the entire position-adjusting mechanism is movable in the Z direction on a vertical plane and bonds the first and second electronic components to each other.

2. The electronic-component alignment method according to claim 1, wherein the first and second electronic components are held such that the alignment holes and the alignment marks, respectively, of the first and second electronic components lie within the focal depth of lenses of the mark-recognition apparatus.

3. The electronic-component alignment method according to claim 1, wherein the mark-recognition apparatus comprises two cameras having an interval therebetween in agreement with that between the two alignment holes of the first electronic component.

4. The electronic-component alignment method according to claim 1, wherein the mark-recognition apparatus comprises a camera laterally movable along the same distance as the interval between the two alignment holes of the first electronic component.

5. The electronic-component alignment method according to claim 1, wherein the mark-recognition apparatus comprises two identical lenses disposed so as to have an interval therebetween in agreement with that between the two alignment holes of the first electronic component; and a camera disposed at the common position on the optical paths of the two lenses.

6. An electronic-component alignment apparatus, comprising:
a receiving table holding a first electronic component having two unobstructed alignment holes perforated at predetermined positions thereof so as to be spaced away from each other by a predetermined interval;
a position-adjusting mechanism holding a second electronic component which is disposed so as to face the receiving table and which has two alignment marks formed at predetermined positions thereon so as to have an interval therebetween in agreement with that between the two aligning holes;
a mark-recognition apparatus which is disposed rearward of the receiving table and which, in a state in which the alignment marks of the second electronic component are visually unobstructed within the alignment holes of the first electronic component, captures the alignment marks and the corresponding alignment holes in the same fields of view thereof and measures the positions of the two components,
wherein, by using images whose positions are measured by the mark-recognition apparatus, the two components are aligned with each other by adjusting the position of the second electronic component with the position-adjusting mechanism such that the alignment marks of the second electronic component lie at predetermined positions in the two alignment holes of the first electronic component,
wherein the position-adjusting mechanism moves and rotates the second electronic component in the X and Y directions and in the θ direction, respectively, on a horizontal plane, and
wherein the entire position-adjusting mechanism is movable in the Z direction on a vertical plane and bonds the first and second electronic components to each other.

7. The electronic-component alignment apparatus according to claim 6, wherein the first and second electronic components are held such that the alignment holes and the alignment marks, respectively, of the first and second electronic components lie within the focal depth of lenses of the mark-recognition apparatus.

8. The electronic-component alignment apparatus according to claim 6, further comprising two cameras having an interval therebetween in agreement with that between the two alignment holes of the first electronic component.

9. The electronic-component alignment apparatus according to claim 6, wherein the mark-recognition apparatus comprises a camera laterally movable along the same distance as the interval between the two alignment holes of the first electronic component.

10. The electronic-component alignment apparatus according to claim 6, wherein the mark-recognition apparatus comprises two identical lenses disposed so as to have an interval therebetween in agreement with that between the two alignment holes of the first electronic component; and a camera disposed at the common position on the optical paths of the two lenses.

11. The electronic-component alignment method according to claim 1, wherein the alignment marks comprise a large circle and small circle concentrically arranged.

* * * * *